(12) United States Patent
Watanabe et al.

(10) Patent No.: US 7,317,211 B2
(45) Date of Patent: Jan. 8, 2008

(54) LIGHT-EMITTING DEVICE, LIGHT-EMITTING APPARATUS, IMAGE DISPLAY APPARATUS, METHOD OF MANUFACTURING LIGHT-EMITTING DEVICE, AND METHOD OF MANUFACTURING IMAGE DISPLAY APPARATUS

(75) Inventors: Toshihiko Watanabe, Kanagawa (JP); Masato Doi, Kanagawa (JP); Nobuaki Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/799,309

(22) Filed: Mar. 12, 2004

(65) Prior Publication Data
US 2004/0195576 A1    Oct. 7, 2004

(30) Foreign Application Priority Data
Mar. 14, 2003  (JP) ............................. P2003-069602
Jan. 16, 2004  (JP) ............................. P2004-009777

(51) Int. Cl.
*H01L 33/00*  (2006.01)

(52) U.S. Cl. ............................. 257/98; 257/79; 257/94; 257/99

(58) Field of Classification Search ................ 257/59, 257/72, 257, 290, 79, 94, 98, 99, 750
See application file for complete search history.

(56) References Cited

U.S. PATENT DOCUMENTS 5,464,716 A * 11/1995 Yashiki ....................... 430/41
6,147,451 A * 11/2000 Shibata et al. .............. 313/506
6,495,862 B1 * 12/2002 Okazaki et al. ............. 257/103
6,720,572 B1 * 4/2004 Jackson et al. .............. 257/40
6,855,958 B2 * 2/2005 Sato et al. ..................... 257/79
6,900,473 B2 * 5/2005 Yoshitake et al. ............ 257/95
6,905,907 B2 * 6/2005 Konuma ........................ 438/99
2002/0000563 A1 * 1/2002 Udagawa ...................... 257/94

FOREIGN PATENT DOCUMENTS

| JP | 09-283801 | 10/1997 |
|---|---|---|
| JP | 11-040853 | 2/1999 |
| JP | 11-177138 | 7/1999 |
| JP | 2001-024222 | 1/2001 |
| JP | 2001-184921 | 7/2001 |
| JP | 2002-260843 | 9/2002 |

* cited by examiner

*Primary Examiner*—Wai-Sing Louie
(74) *Attorney, Agent, or Firm*—Bell, Boyd & Lloyd LLP

(57) ABSTRACT

Light-emitting devices, light-emitting apparatuses, image display apparatuses and methods of manufacturing same are provided. The devices and apparatuses include a transparent electrode that is connected directly to light output surfaces so as to cover the whole areas of the light output surfaces. The transparent electrode is formed to be larger in area than the light output surfaces, and are securely electrically connected to n-type semiconductor layers including the light output surfaces.

22 Claims, 29 Drawing Sheets

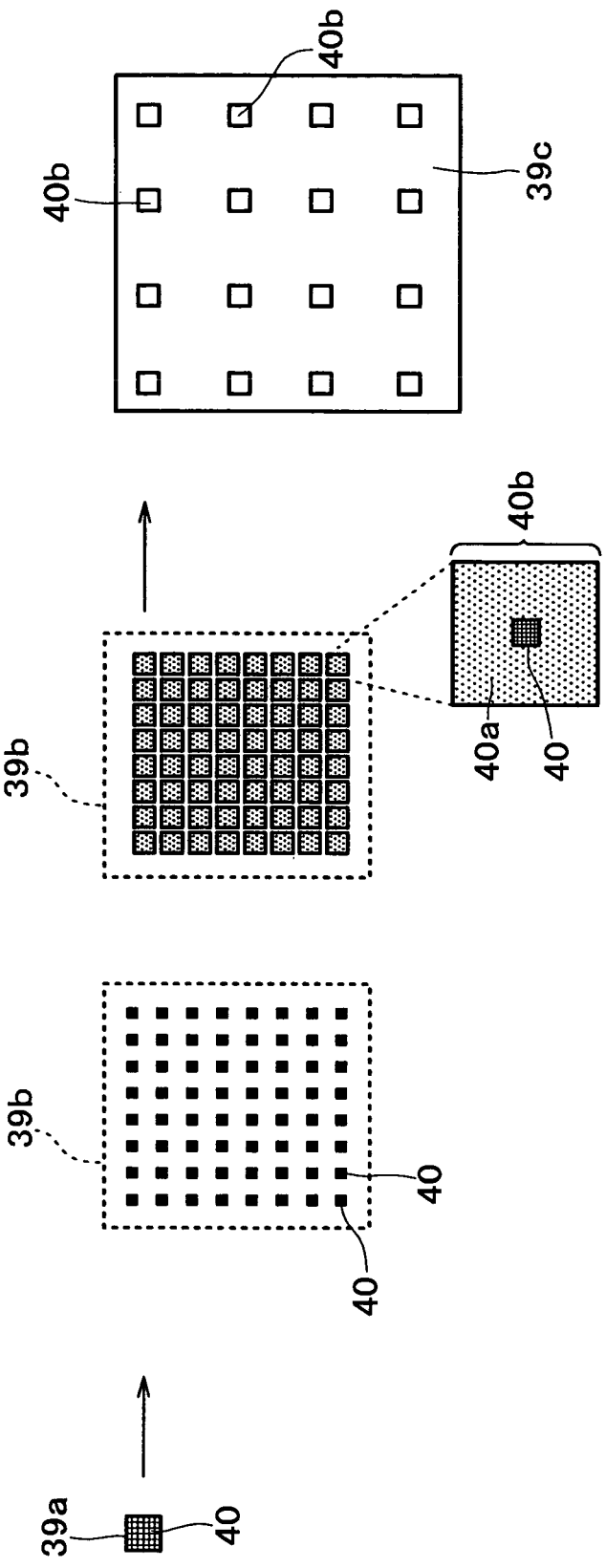

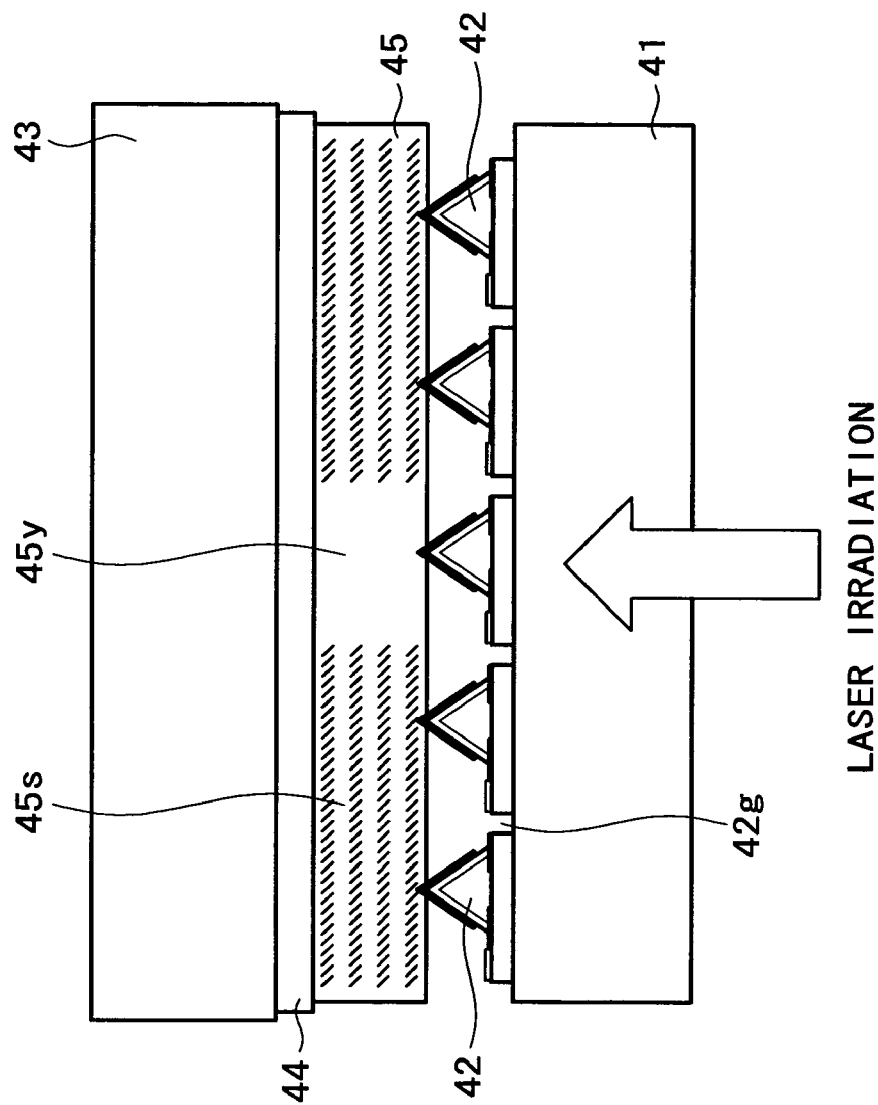

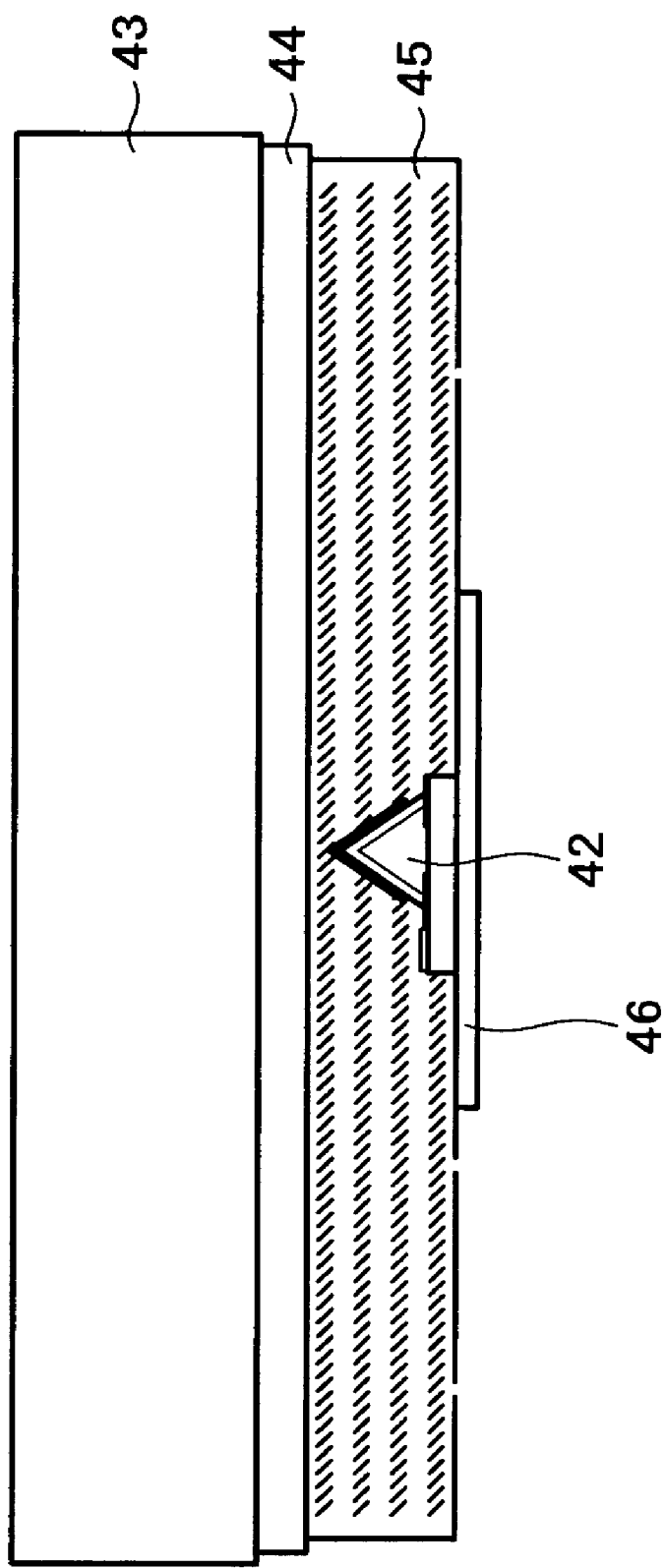

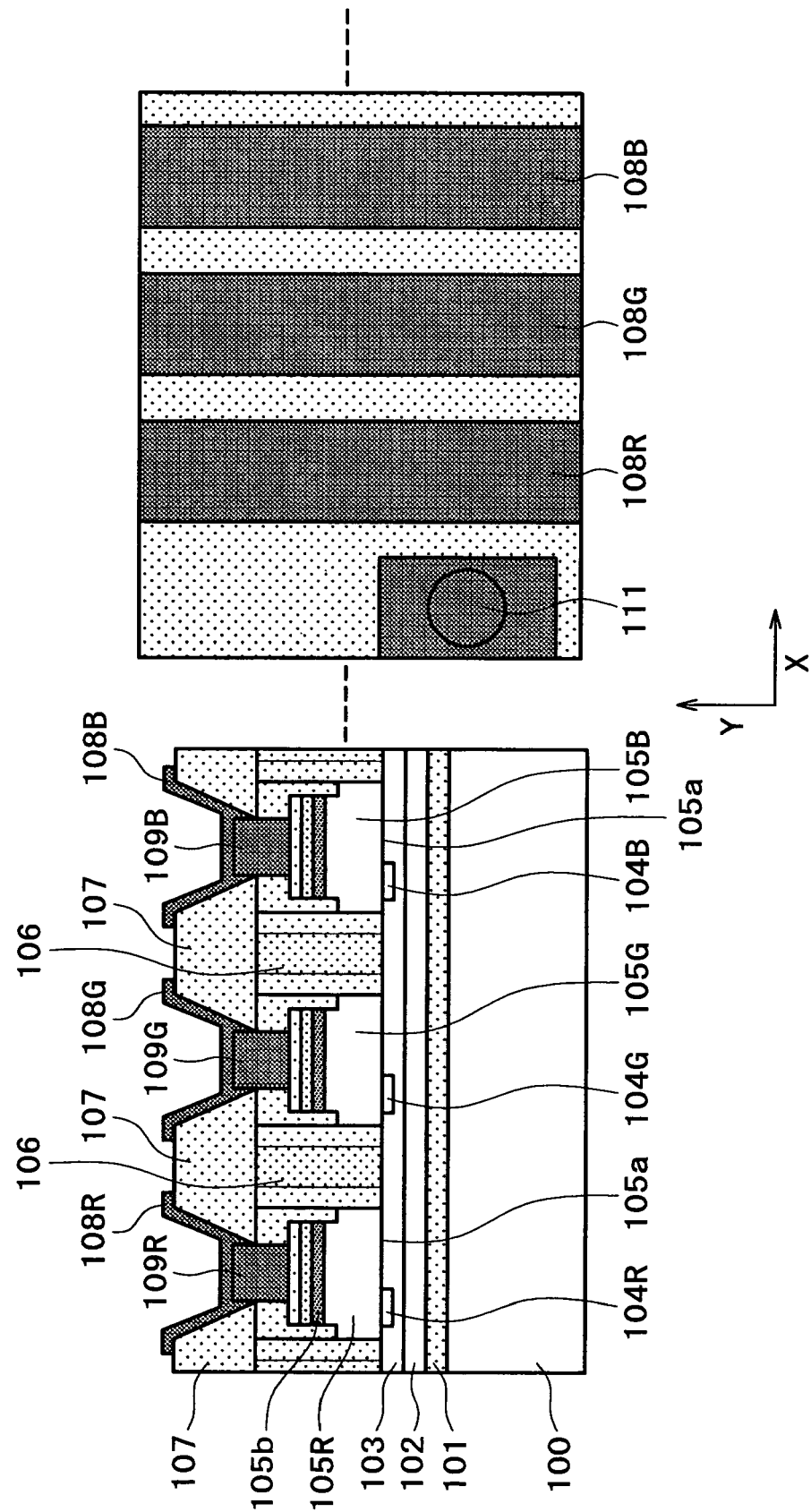

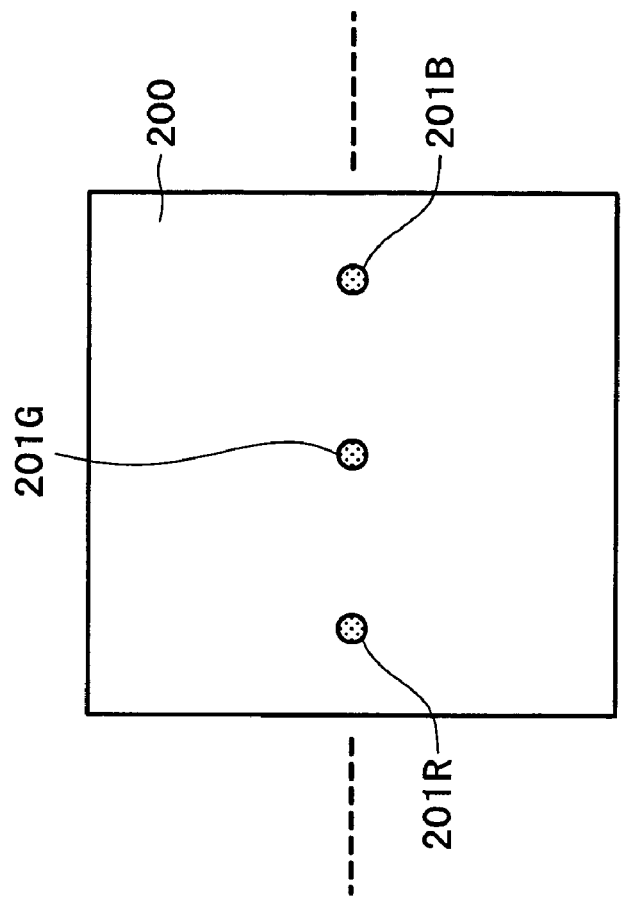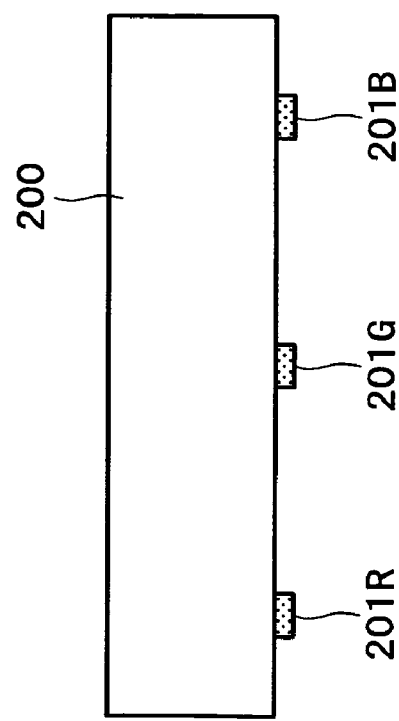

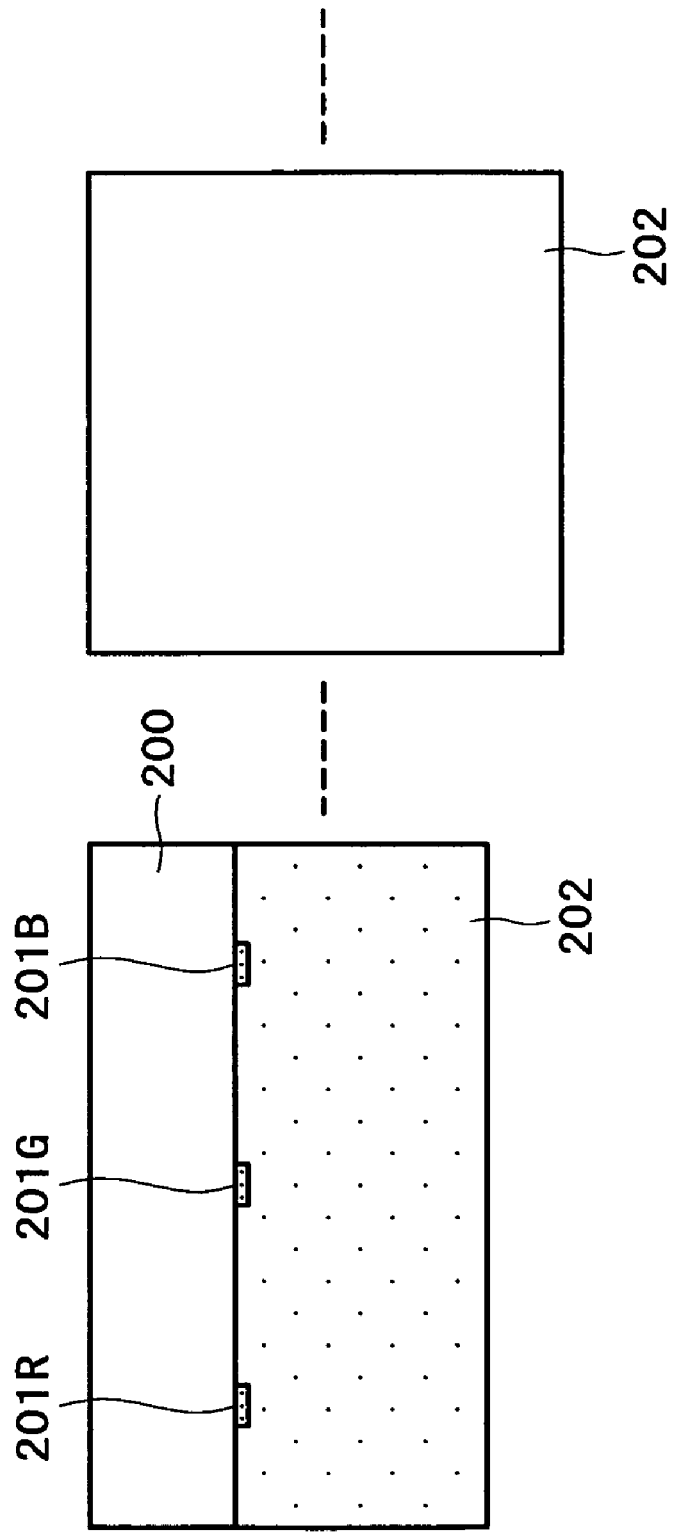

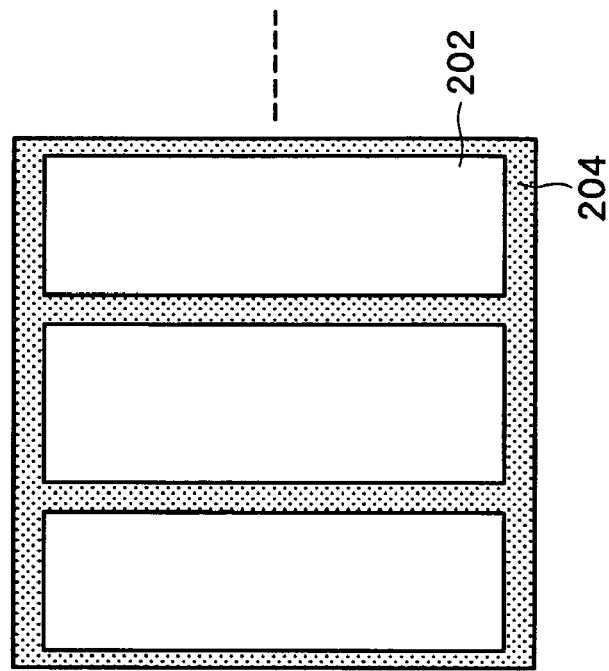
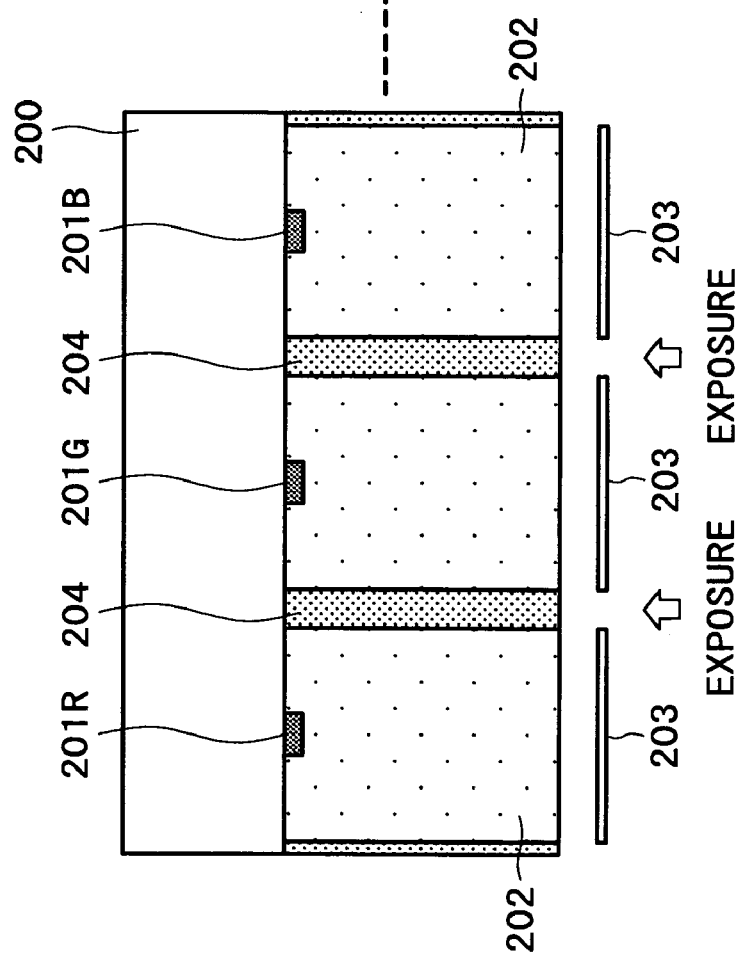

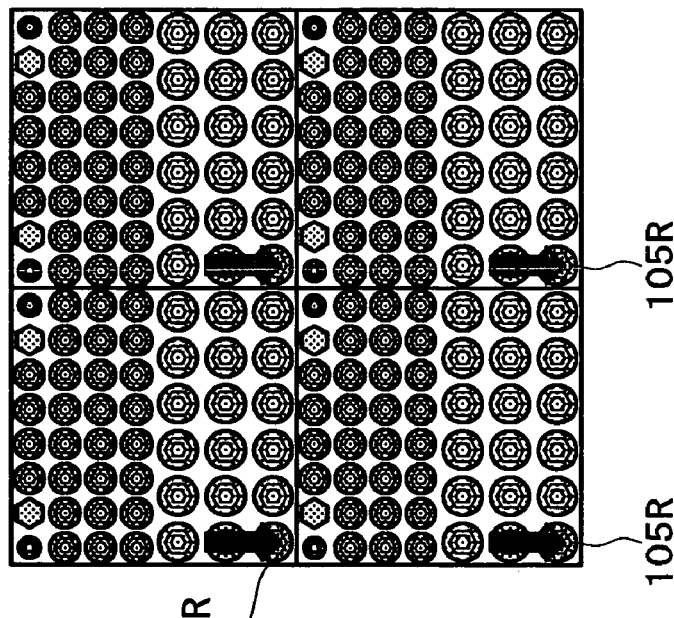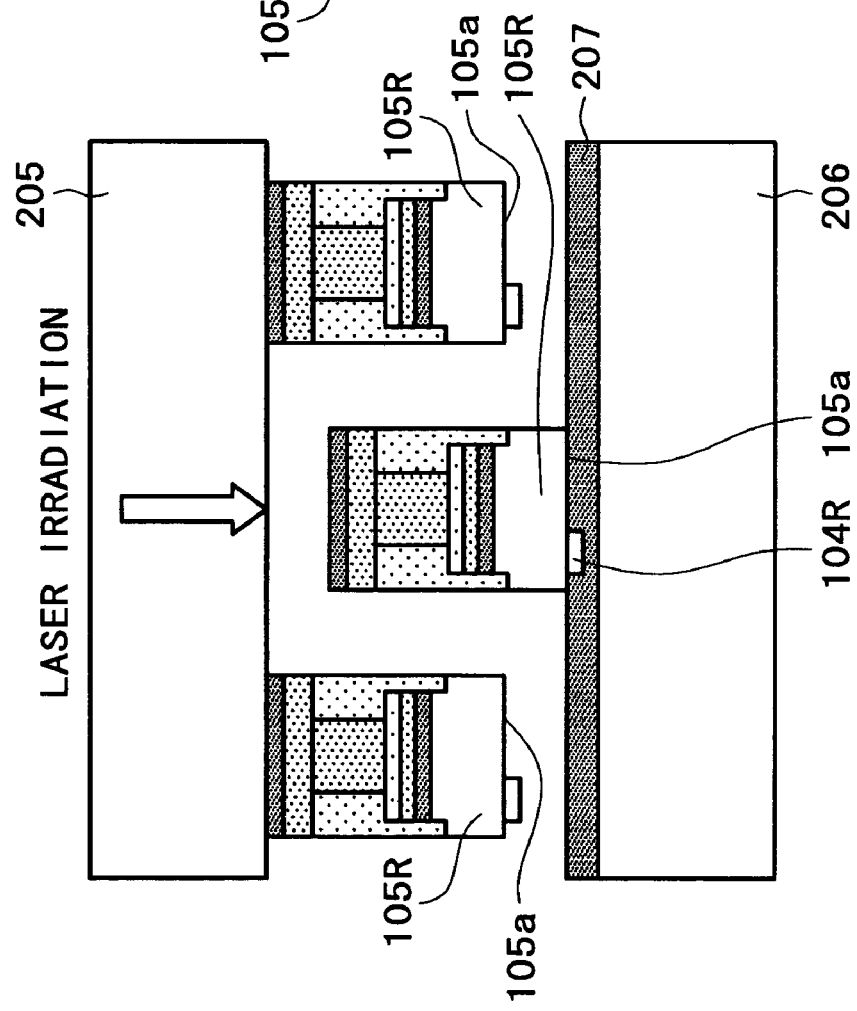

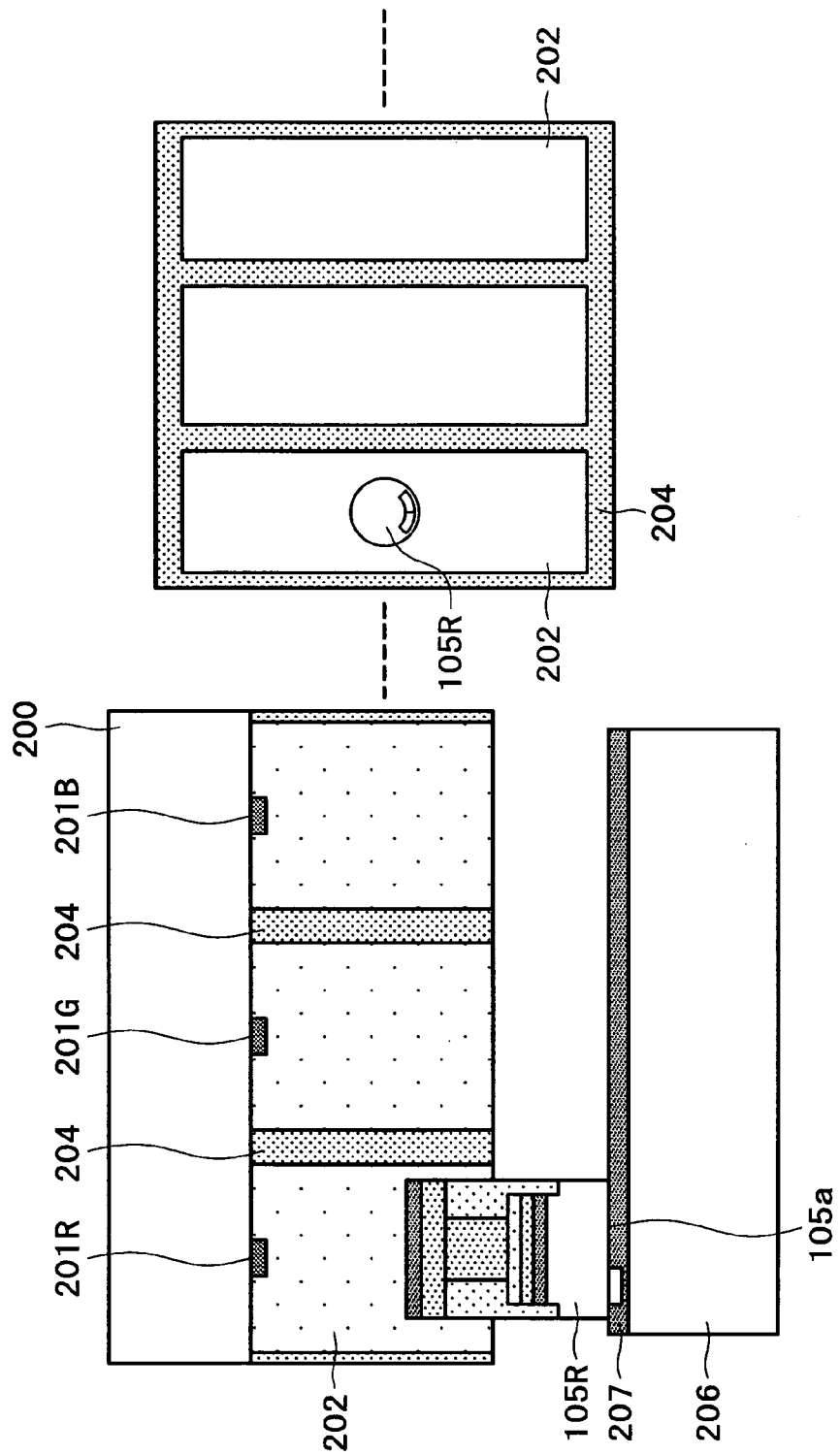

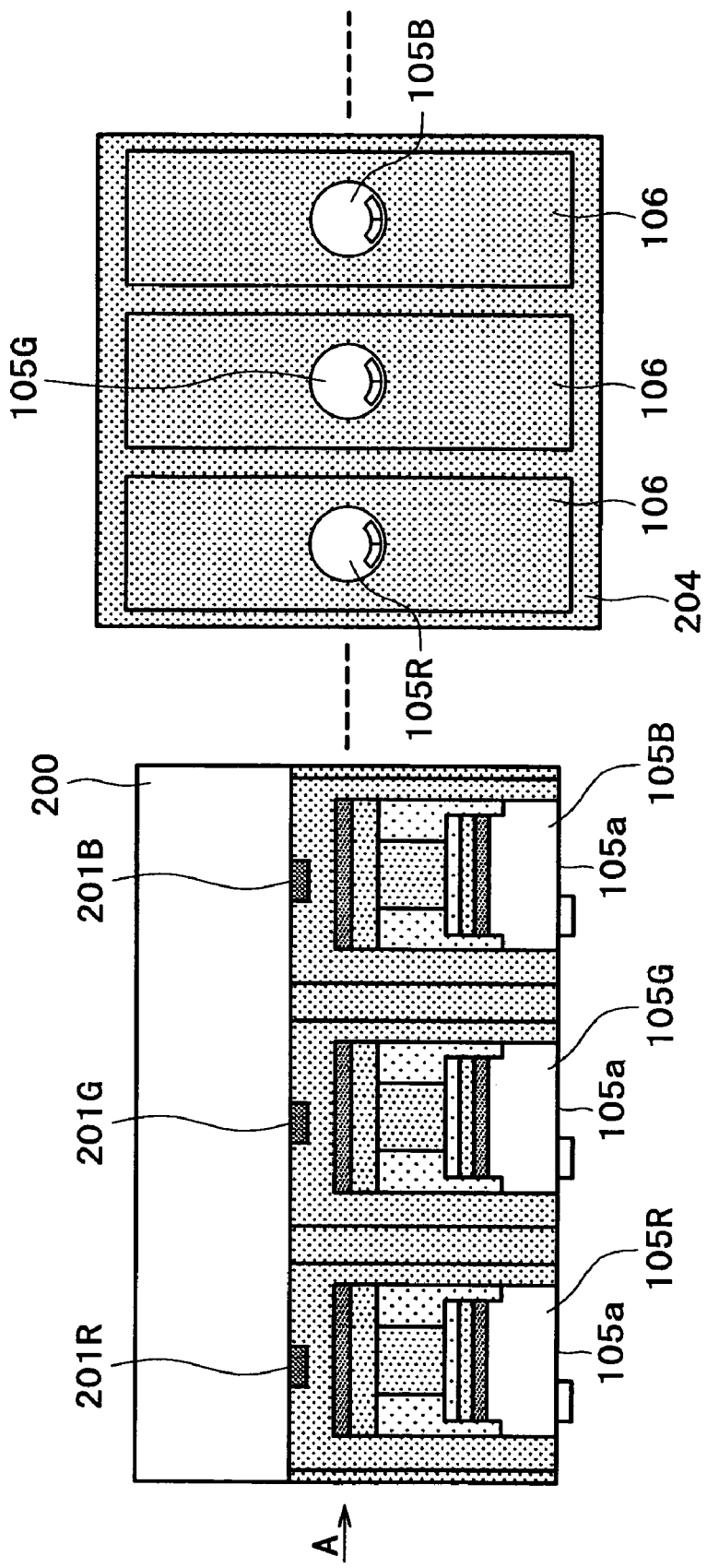

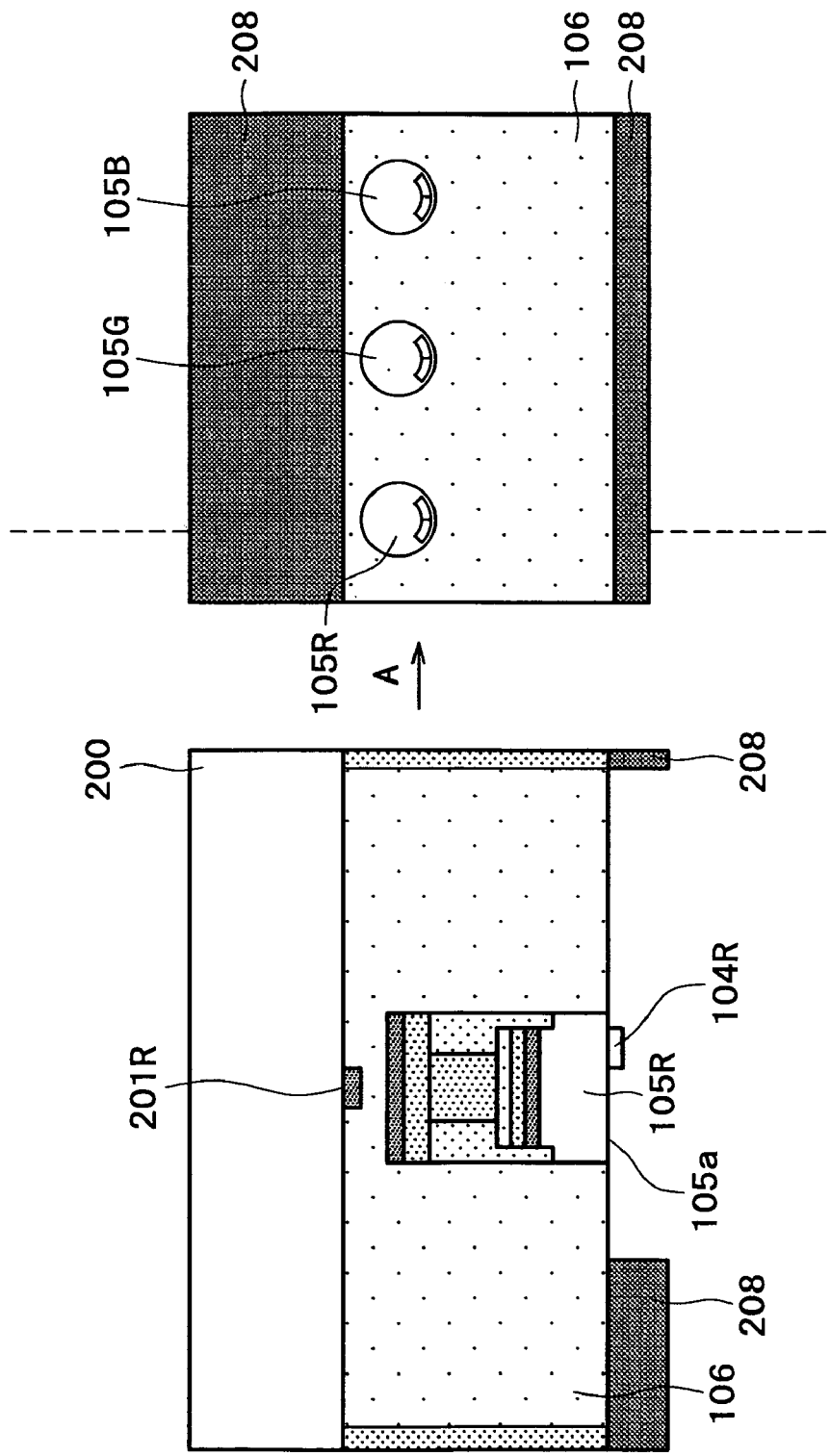

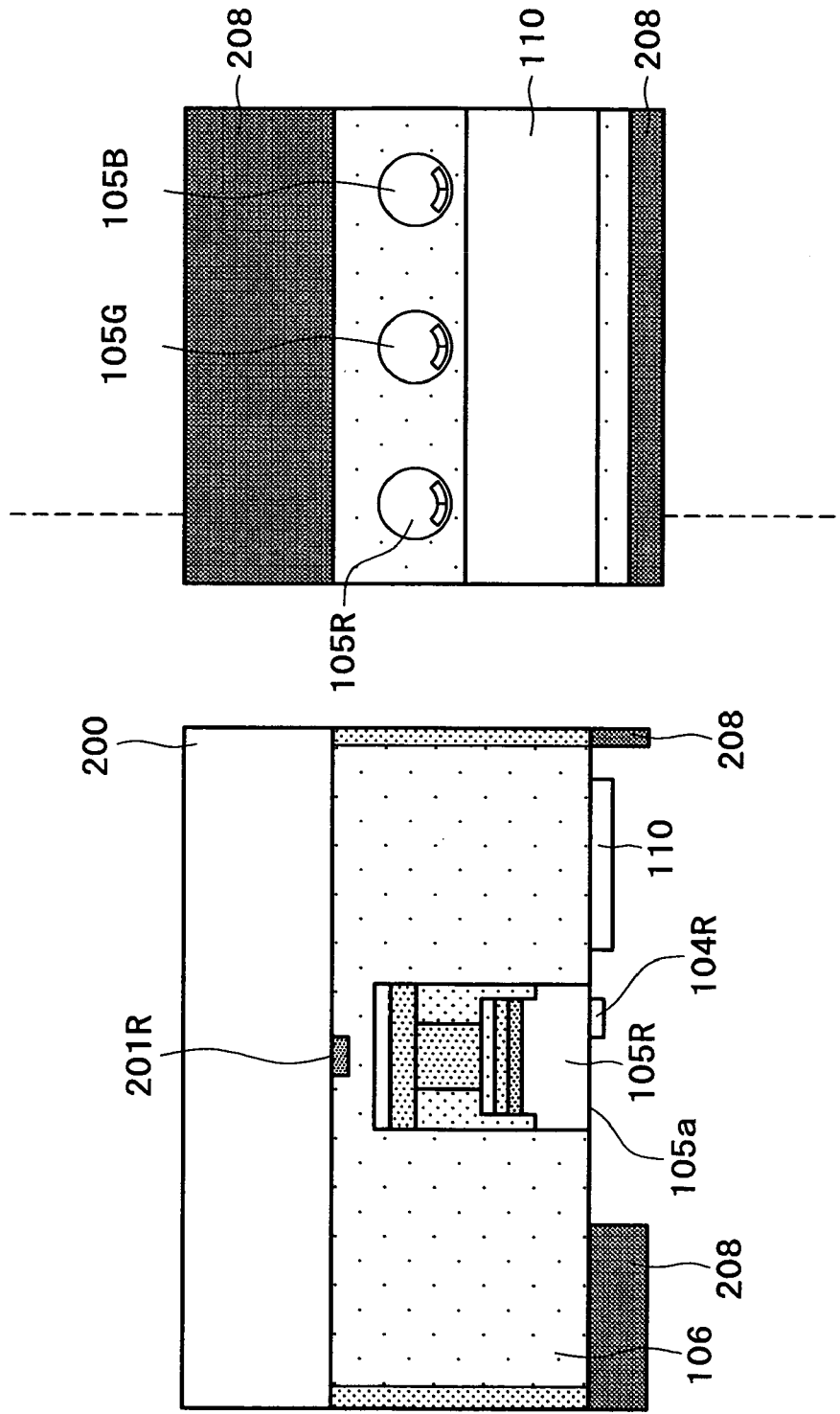

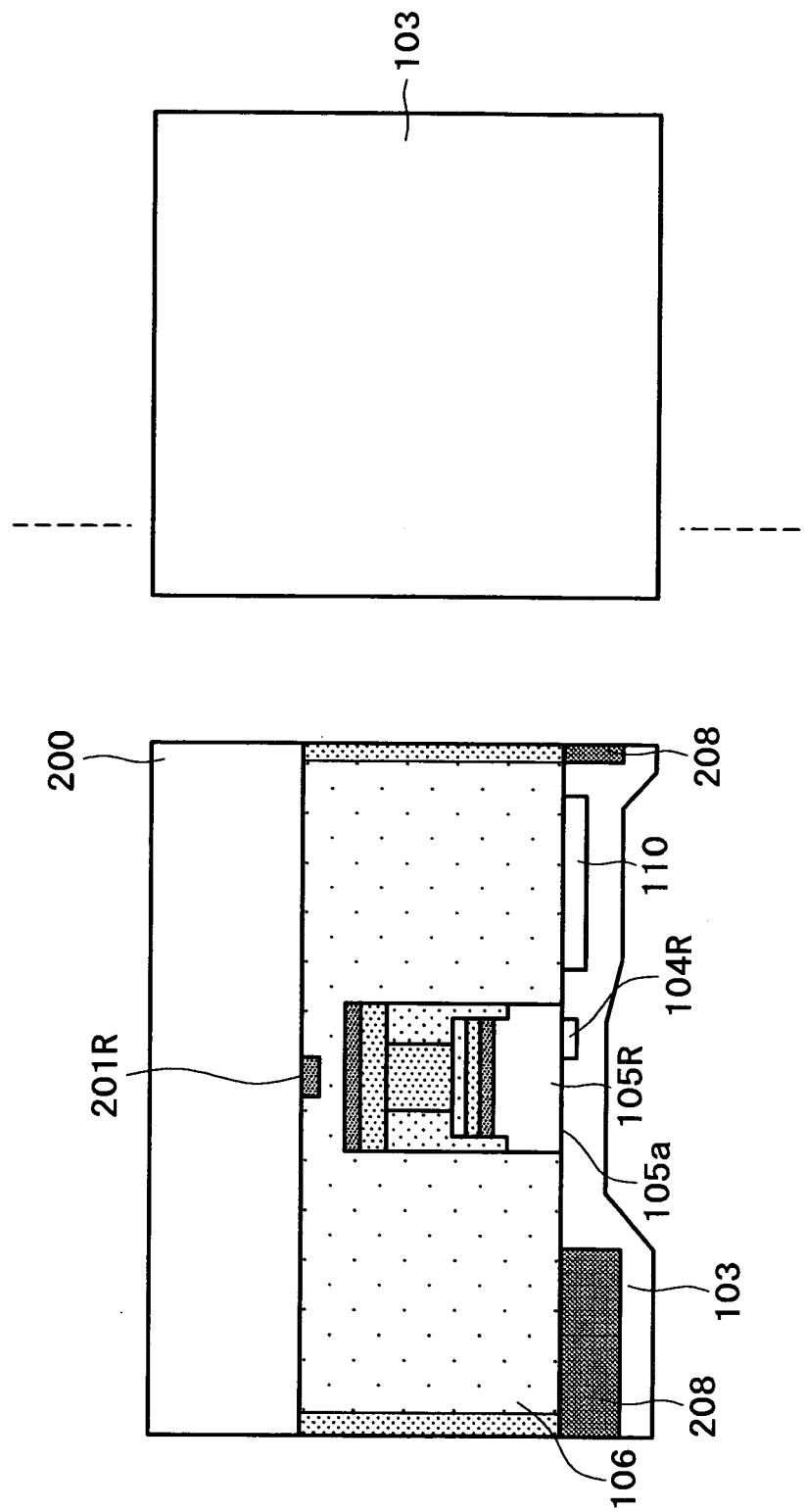

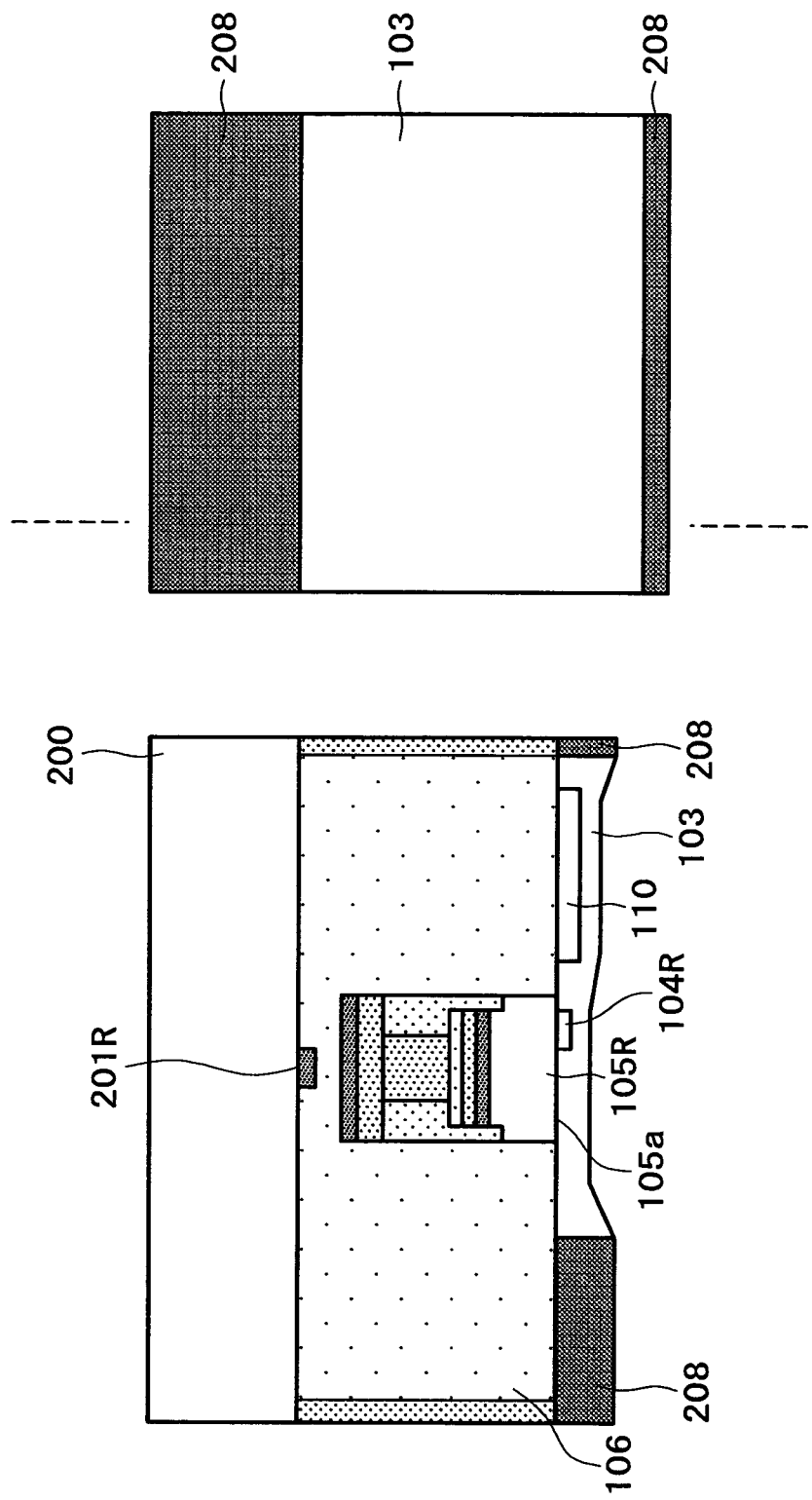

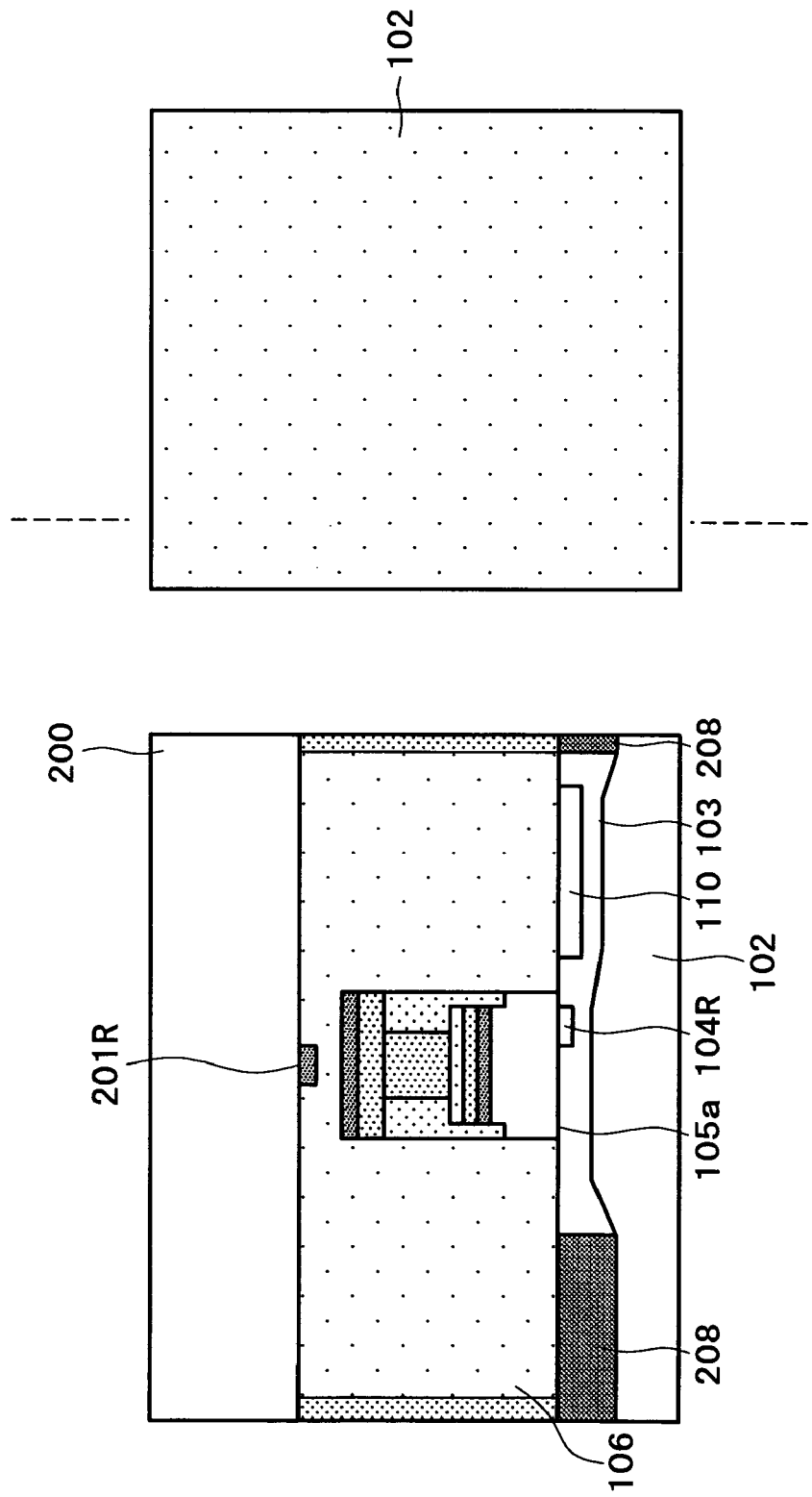

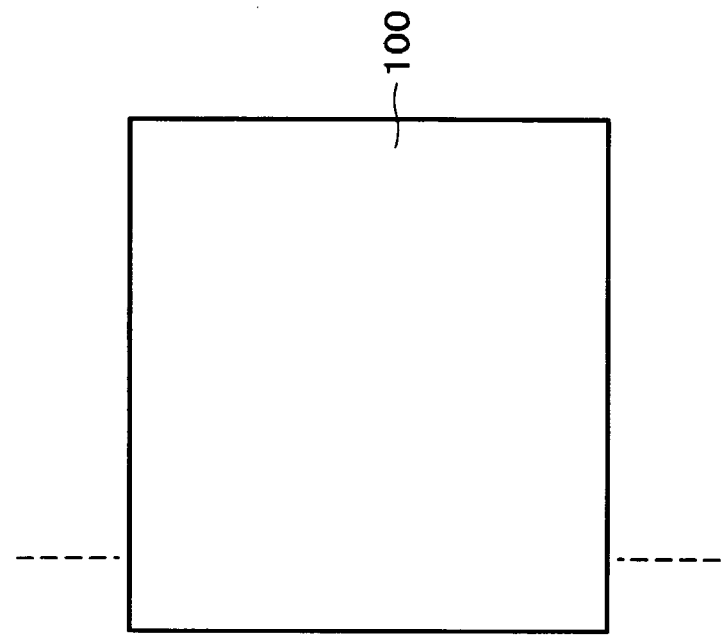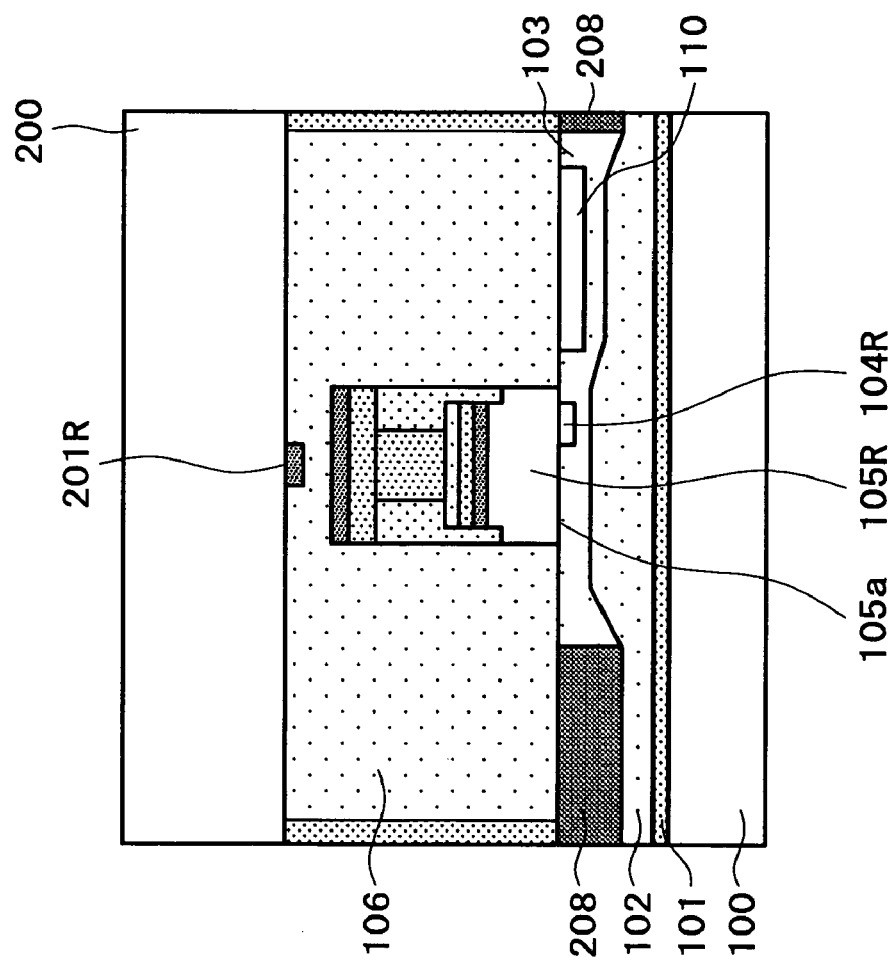

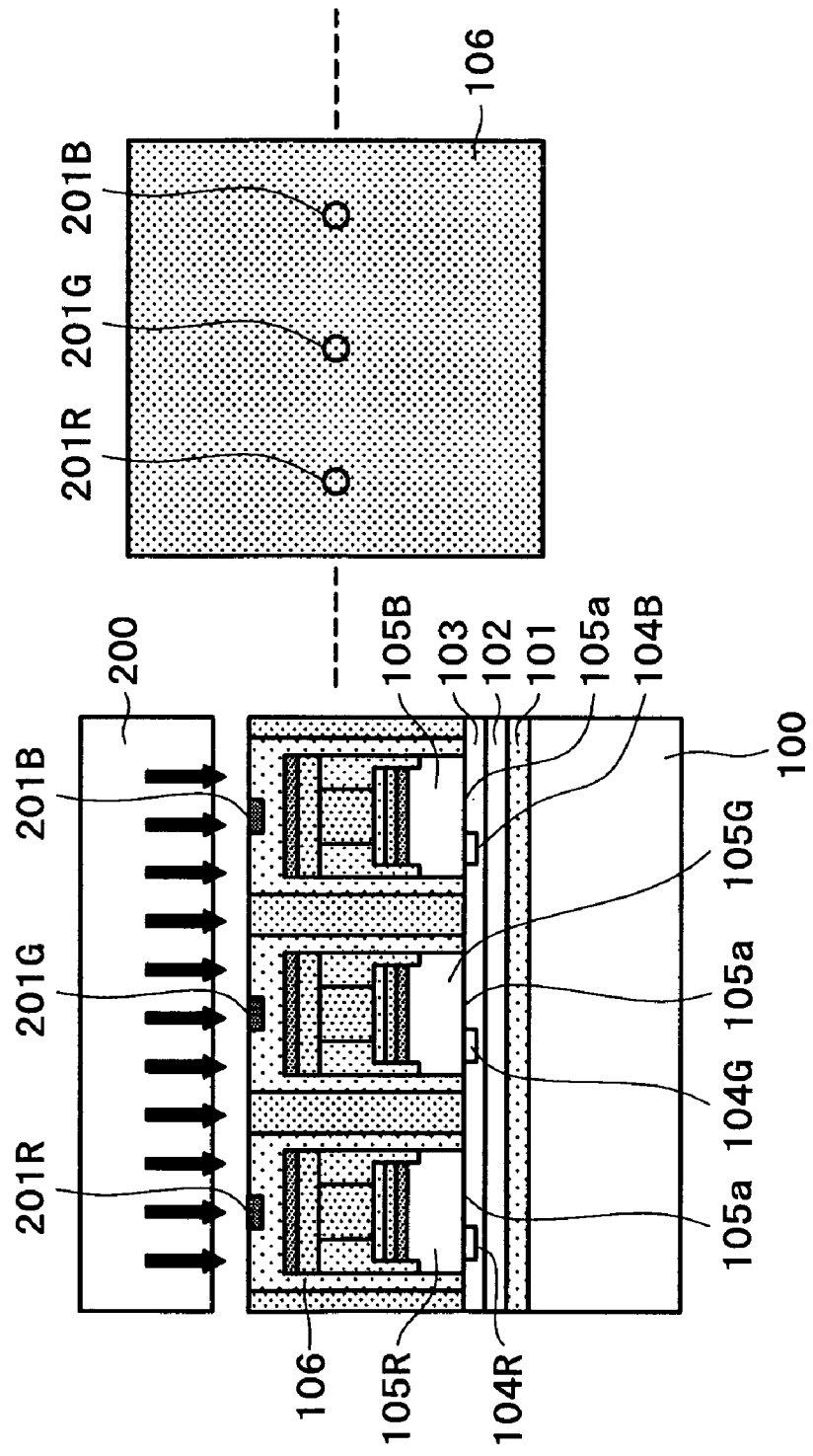

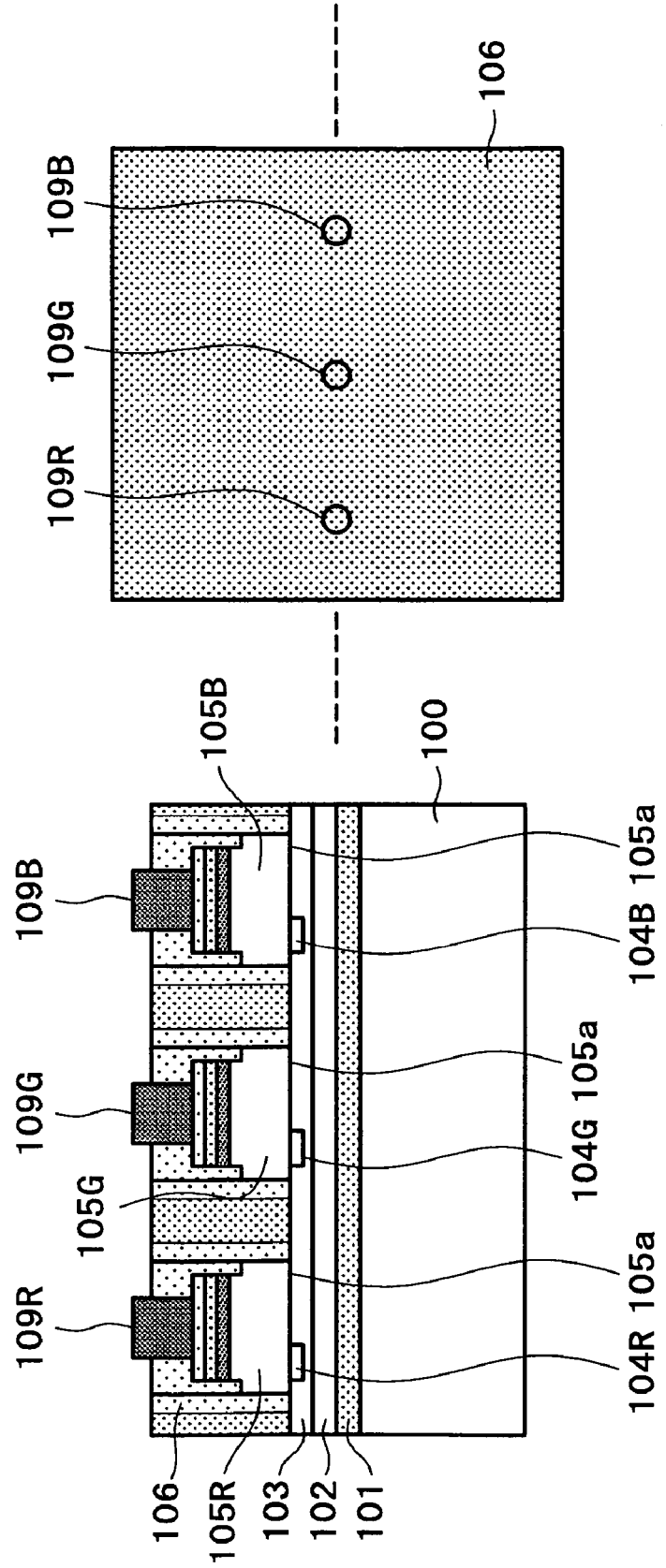

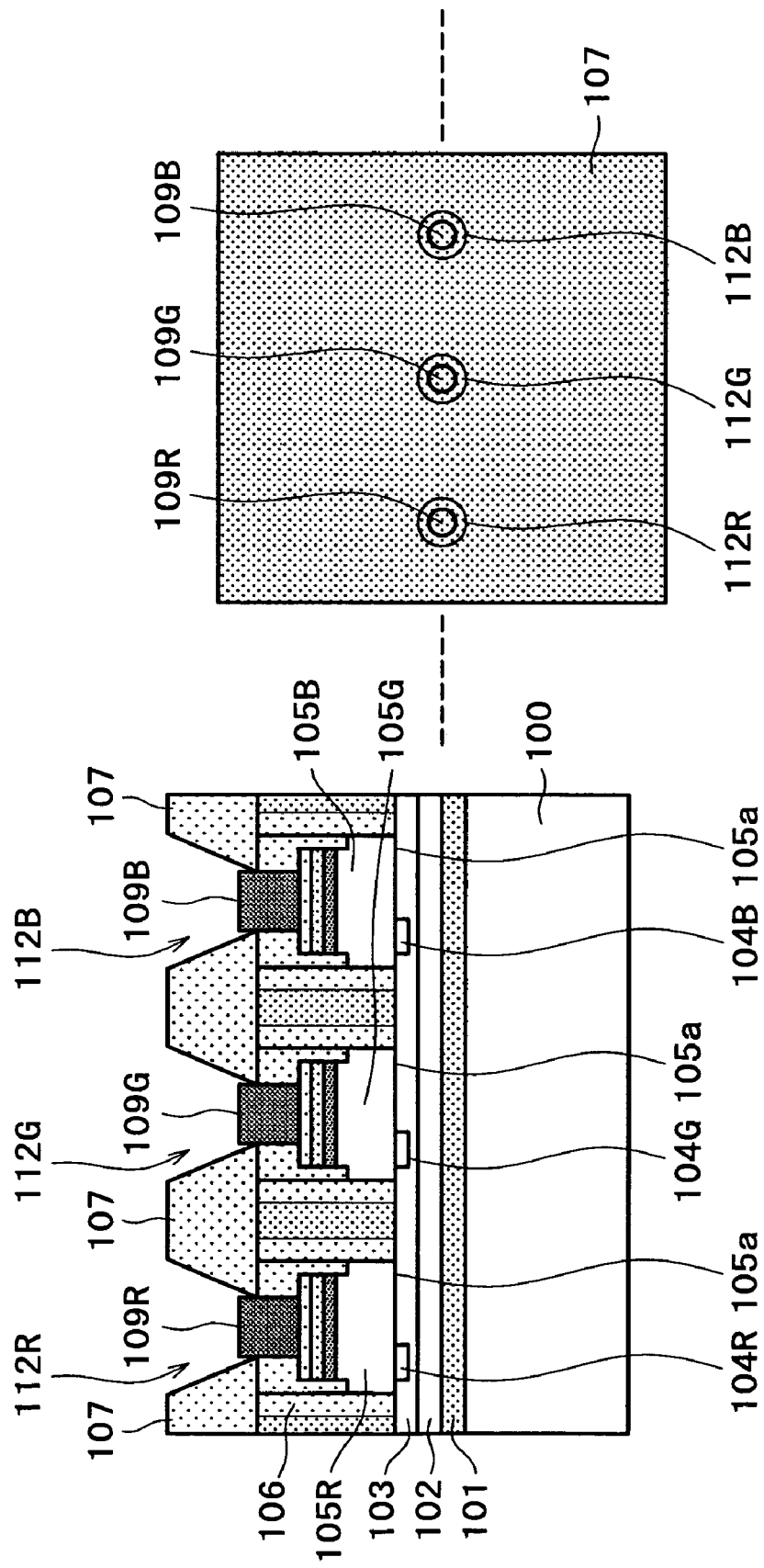

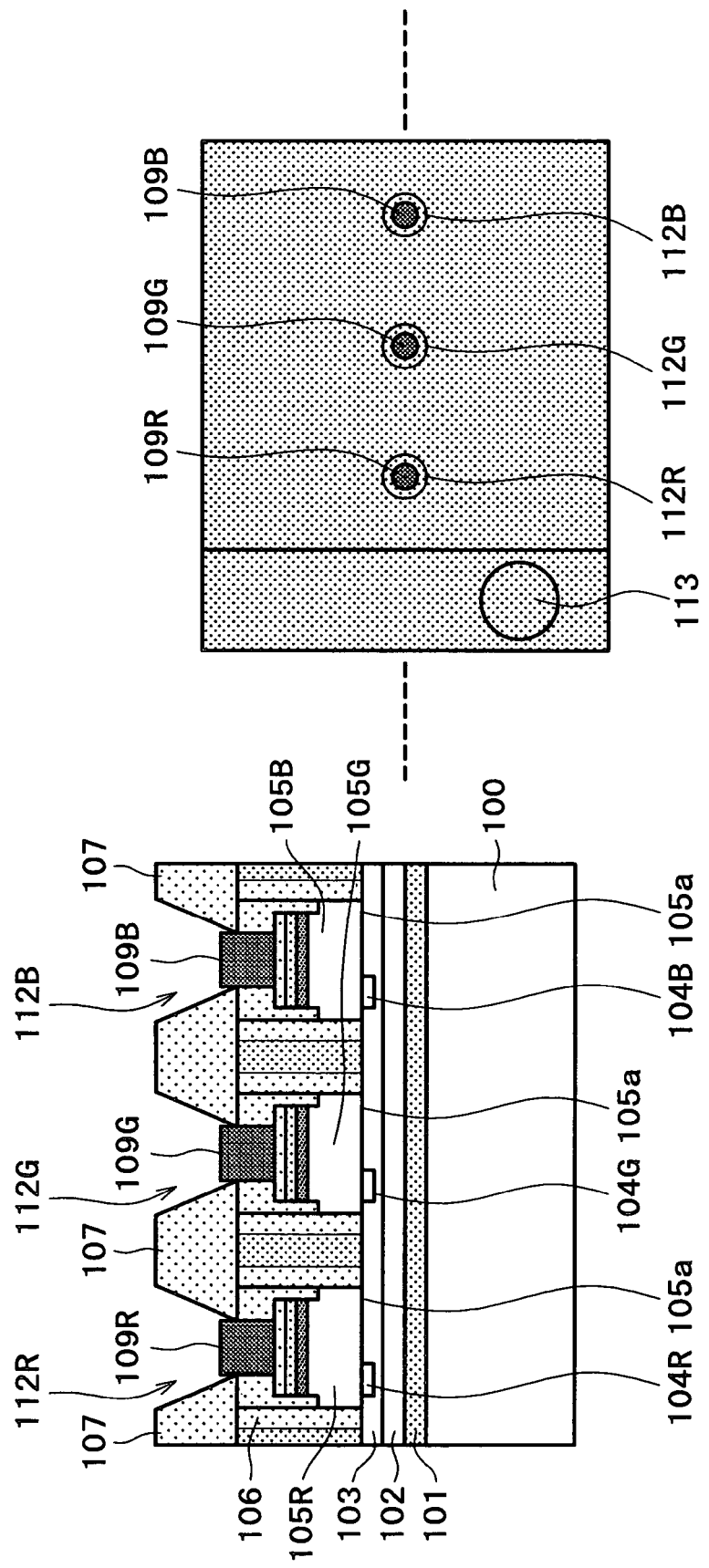

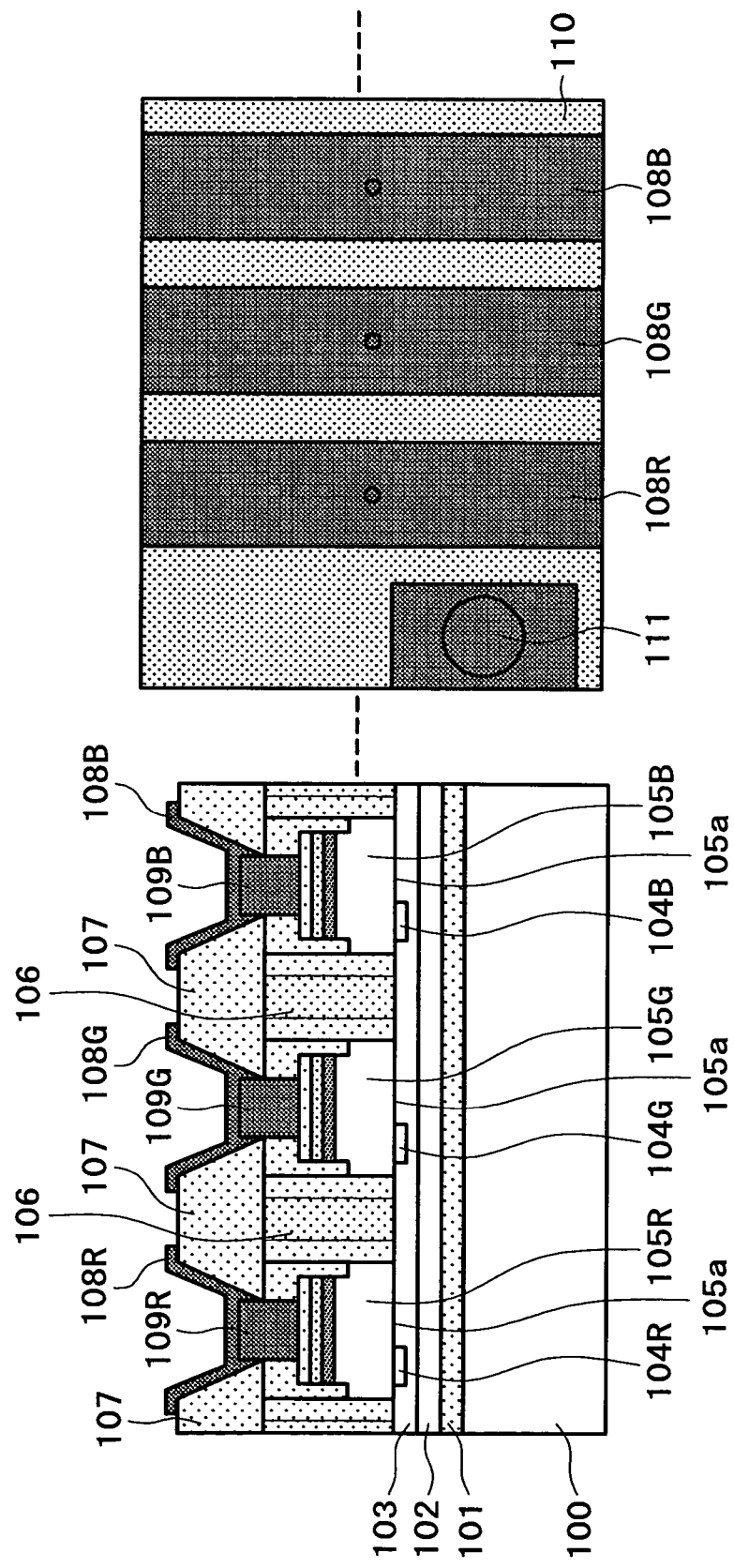

LIGHT-EMITTING DEVICE, LIGHT-EMITTING APPARATUS, IMAGE DISPLAY APPARATUS, METHOD OF MANUFACTURING LIGHT-EMITTING DEVICE, AND METHOD OF MANUFACTURING IMAGE DISPLAY APPARATUS

CROSS REFERENCES TO RELATED APPLICATIONS

This application claims priority to application of Japanese Patent Application Nos. P2003-069602 filed Mar. 14, 2003, and P2004-009777 filed Jan. 16, 2004, the disclosures of which are herein incorporated by reference.

BACKGROUND OF THE INVENTION

The present invention relates to a light-emitting device, a light-emitting apparatus, an image display apparatus, a method of manufacturing a light-emitting device, and a method of manufacturing an image display apparatus. More particularly, the present invention relates to a light-emitting device, a light-emitting apparatus, an image display apparatus, a method of manufacturing a light-emitting device, and a method of manufacturing an image display apparatus in which light emission efficiency is prevented from being lowered and an electrode is formed for minute light-emitting device main bodies with high accuracy.

At present, in electronic apparatuses and the like, there have been widely used those configured by arranging a multiplicity of minute devices, electronic component parts, electronic devices, and electronic component parts obtained by embedding these in an insulator such as a resin. For example, in the case of assembling an image display apparatus by arranging light-emitting devices in a matrix form, conventionally, there has been practiced a method of forming the devices directly on a substrate as in the cases of a Liquid Crystal Display apparatus (LCD) and a Plasma Display Panel (PDP) or a method of arranging single Light-Emitting Diode (LED) packages as in the case of an LED display.

Besides, since LEDs as light-emitting devices are expensive, an image display apparatus using the LEDs can be manufactured at low cost by manufacturing a large number of LED chips from one sheet of wafer. Namely, when the LEDs are miniaturized from the conventional size of about 300 μm square to a size of several tens of micrometers square and are connected to produce an image display apparatus, it is possible to lower the price of the image display apparatus. An electrode for such a minute light-emitting device is in many cases produced by a method in which a metallic film is formed as the electrode at a part of a light output surface of a light-emitting device main body, and the electrode is connected to a wiring through a metallic film or a gold wire.

On the other hand, the light-emitting device is electrically connected to a wiring for driving the light-emitting device, and emits light from a predetermined light emission region to the exterior of the device. Therefore, it is important to prevent the light output efficiency from being lowered, by ensuring that the light emitted from the light emission region to the exterior of the device is not shielded by the wiring and/or the electrode formed in the light emission region. In view of this, for example, in relation to light-emitting devices such as a planar light-emitting thyristor and an organic EL device, there has been known a technology of forming a transparent electrode so as not to shield the light emitted from the light emission region (see, for example, Japanese Patent Laid-open No. Hei 9-283801, and Japanese Patent Laid-open No. 2002-260843).

However, it is difficult to form an electrode accurately at the light output surface in a minute light-emitting device. For example, in the case of forming an electrode for a minute light-emitting device main body in which the size of the light output surface is about 10 μm square or below, an accuracy of within about 10 μm is needed for alignment between the light output surface and the electrode. Besides, even in the case where an electrode is formed at the light output surface by use of a light-transmitting material so as not to lower the light output efficiency, also, the formation of the electrode accurately at the light output surface becomes more difficult as the size of the light-emitting device becomes smaller. Furthermore, as the size of the light-emitting device is reduced, the connection between the electrode and the light-emitting device main body would become insufficient, possibly leading to a trouble in driving the light-emitting device.

SUMMARY OF THE INVENTION

The present invention has been made in consideration of the above problems. In an embodiment, the present invention provides a light-emitting device, a light-emitting apparatus, an image display apparatus, a method of manufacturing a light-emitting device, and a method of manufacturing an image display apparatus in which light output efficiency concerning the light emitted from a light-emitting device main body is enhanced even in the case of a minute light-emitting device and a required electrode is securely formed for the light-emitting device main body.

In accordance with a first aspect of the present invention in an embodiment, there is provided a light-emitting device including a light-emitting device main body having a light output surface and transferred, and a transparent electrode formed in a size larger than the size of the light output surface so as to cover the light output surface and connected directly to the whole area of the light output surface. According to the light-emitting device, even where the light-emitting device is minute in size, it is possible to accurately connect the transparent electrode and the light output surface to each other, and to suppress the possibility of various troubles such as contact failure in driving the light-emitting device. Furthermore, the transparent electrode does not shield the light emitted from the light output surface, and the light output efficiency can be enhanced, as compared with the case where the light is shielded by a metallic electrode.

In the light-emitting device as above, the transparent electrode in an embodiment preferably provides direct connection between a wiring for supplying electric power to the light-emitting device main body and the light-emitting device main body. According to such a transparent electrode, it is unnecessary to connect the electrode formed for the light-emitting device main body to the wiring through a separately formed connection wire, and the direct connection between the light-emitting device and the wiring through the transparent electrode promises accurate connection between the electrode and the wiring even where the light-emitting device is minute in size.

In accordance with a second aspect of the present invention in an embodiment, there is provided a light-emitting device including a light-emitting device main body having a light output surface, and a transparent electrode formed in a size larger than the size of the light output surface so as to cover the light output surface. The light-emitting device main body is provided in the form of a chip composed of a plurality of semiconductor layers, and the transparent electrode is connected directly to the whole area of the light output surface and connected to side surfaces of the semiconductor layer including the light output surface. According to such a light-emitting device, particularly, the ratio of the area of the side surfaces to the area of connection between the transparent electrode and the light-emitting device main body is relatively increased as the light-emitting device becomes more minute in size. Therefore, by forming the transparent electrode not only on the light output surface but also on the side surfaces, it is possible to increase the area of connection between the light-emitting device main body and the transparent electrode, and to enhance the reliability of the connection condition between the light-emitting device main body and the electrode.

Further, in the light-emitting device as above, the transparent electrode in an embodiment is preferably connected to the side surfaces of the semiconductor layer including the light output surface through a contact layer. According to such a light-emitting device, by making the connection through the contact layer, it is possible to further enhance the connection performance between the transparent electrode and the light-emitting device main body, and to provide a light-emitting device having high reliability.

In addition, in the light-emitting device as above, preferably, the refractive index of the transparent electrode in an embodiment is lower than the refractive index of the semiconductor layer including the light output surface and is higher than the refractive index of a resin layer formed on the upper side of the transparent electrode. According to such a transparent electrode, light output efficiency can be enhanced, as compared with the case where light is reflected at the interface between the light-emitting device main body and a resin layer directly covering the light-emitting device main body.

Furthermore, in the light-emitting device as above, the transparent electrode is preferably formed by coating the light output surface with a paste containing conductive particulates dispersed in a light-transmitting resin. By applying such a paste directly to the light output surface of the light-emitting device, it is possible to connect the light-emitting device main body and the transparent electrode to each other while generating little gap therebetween. Further, when the paste is applied, the paste goes round onto the side surfaces of the light-emitting device main body, whereby the light-emitting device main body and the transparent electrode can be securely connected to each other.

Furthermore, in the light-emitting device as above, preferably, the conductive particulates scatter the light emitted from the light output surface and diffuse the light from the transparent electrode to the exterior of the device. Such conductive particulates can scatter the light coming into the transparent electrode and diffuse the light to a wide range, so that the light can be emitted from the light output surface to a wide range. Therefore, even if the light-emitting device is minute in size, the light-emitting device can have an apparent light emission surface greater than the actual size of the light-emitting device.

In accordance with a third aspect of the present invention in an embodiment, there is provided a light-emitting device including a light-emitting device main body having a light output surface, and a transparent electrode formed in a size larger than the size of the light output surface so as to cover the light output surface and connected directly to the whole area of the light output surface. According to such a light-emitting device, it is possible to accurately connect the transparent electrode and the light output surface to each other even where the light-emitting device is minute in size, and it is possible to enhance light output efficiency, as compared with the case where a metallic electrode is formed.

In accordance with a fourth aspect of the present invention in an embodiment, there is provided a light-emitting apparatus including a plurality of light-emitting device main bodies each having a light output surface and transferred, and a transparent electrode formed to be larger in a size than the light output surfaces so as to cover the light output surfaces and connected directly to the whole areas of the light output surfaces. In such a light-emitting apparatus, even where the light-emitting device main bodies are minute in size, the transparent electrode formed to be larger in size than the light-emitting devices ensures that the transparent electrode can be easily connected to each of the light output surfaces, without accurately forming the transparent electrode relative to the positions of the individual light-emitting devices.

In the light-emitting apparatus as above, preferably, the transparent electrode in an embodiment is formed collectively on the light output surfaces of the plurality of light-emitting device main bodies. Therefore, the electrode can be formed on the light output surfaces easily and securely, without forming the electrode individually for each of the light-emitting device main bodies.

Further, in the light-emitting apparatus as above, preferably, the transparent electrode in an embodiment is formed by coating the light output surfaces with a paste containing conductive particulates dispersed in a light-transmitting resin. When such a paste is used, the conductive particulates dispersed in the paste make contact with each other in the transparent electrode and, further, make contact with the light output surfaces, too. Therefore, electrical connection between the light output surfaces and the electrode can be secured.

Furthermore, in the light-emitting apparatus as above, preferably, the conductive particulates in an embodiment scatter the light emitted from the light output surfaces and diffuse the light from the transparent electrode to the exterior of the apparatus. With such conductive particulates, it is possible to diffuse to a wide range the light emitted from the light-emitting device main bodies provided as minute light sources, and to emit the light from the whole region of the light emission surface of the light-emitting apparatus.

In accordance with a fifth aspect of the present invention in an embodiment, there is provided an image display apparatus including an image display surface formed by arranging a plurality of light-emitting devices on an apparatus substrate, each of the light-emitting devices including a light-emitting device main body having a light output surface and transferred, and a transparent electrode formed in a size larger than the size of the light output surface so as to cover the light output surface and connected directly to the whole area of the light output surface. According to such an image display apparatus, even where each of the light-emitting device main bodies is minute in size, a larger apparent light emission surface can be obtained, so that light can be emitted from the whole part of the image display surface and image quality can be thereby enhanced.

In accordance with a sixth aspect of the present invention in an embodiment, there is provided a method of manufacturing a light-emitting device, including the steps of transferring a light-emitting device main body having a light output surface onto a resin portion so as to expose the light output surface, forming a resist film on the light output surface and the surface of the resin portion, providing the resist film with an opening portion larger in size than the light output surface so that the opening portion fronts on the light output surface, and forming a transparent electrode in the opening portion so that the transparent electrode is connected directly to the whole area of the light output surface. With the transparent electrode formed in such an opening portion, the transparent electrode can be formed directly for the light-emitting device so as to cover the light output surface, and the transparent electrode can be formed for each light-emitting device easily and securely, without conducting alignment for accurately forming a transparent electrode for a minute light-emitting device.

Further, in the method of manufacturing a light-emitting device as above in an embodiment, preferably, the opening portion is so formed as to front on a wiring for supplying electric power to the light-emitting device main body, and the light output surface and the wiring are connected directly to each other through the transparent electrode. With such a transparent electrode, the light-emitting device main body and the wiring can be connected directly to each other. Therefore, where the light-emitting device is minute in size, the light-emitting device main body and the wiring can be securely connected to each other without separately forming a connection wire with high accuracy.

In accordance with a seventh aspect of the present invention in an embodiment, there is provided a method of manufacturing a light-emitting device, including the steps of forming a resist film on a light output surface of a light-emitting device main body, providing the resist film with an opening portion larger in size than the light output surface so that the opening portion fronts on the light output surface, and forming a transparent electrode in the opening portion so that the transparent electrode is connected directly to the whole area of the light output surface. According to such a method of manufacturing a light-emitting device, the transparent electrode can be formed accurately, without conducting alignment for forming the transparent electrode for the light-emitting device.

In accordance with an eighth aspect of the present invention in an embodiment, there is provided a method of manufacturing an image display apparatus, including the steps of transferring, fixing, and disposing a plurality of light-emitting device main bodies each having a light output surface onto a resin portion so as to expose the light output surfaces, forming a resist film on the light output surfaces and the surface of the resin portion, providing the resist film with an opening portion larger in size than the light output surfaces so that the opening portion fronts on the light output surfaces, and forming a transparent electrode in the opening portion so that the transparent electrode is connected directly to the whole areas of the light output surfaces. According to such a method of manufacturing an image display apparatus, the transparent electrode can be formed for each light-emitting device, without conducting alignment for forming the transparent electrode for the individual light-emitting devices.

In the method of manufacturing an image display apparatus as above in an embodiment, preferably, the opening portion is so formed as to front on a wiring for supplying electric power to the plurality of light-emitting device main bodies, and the light output surfaces and the wiring are connected to each other collectively through the transparent electrode. Therefore, even in the case of an image display apparatus in which a plurality of light-emitting devices are arranged, the connection between the wiring and each of the devices can be easily achieved without lowering the light output efficiency.

In accordance with a ninth aspect of the present invention in an embodiment, there is provided a light-emitting apparatus including: a light-emitting device including a light-emitting device main body having a light output surface and transferred, and a contact metal formed on the light output surface; a wiring layer formed outside the region of the light output surface; and a transparent electrode so formed as to cover the contact metal and the wiring layer. With the transparent electrode so formed as to cover the contact metal and the wiring layer, electrical connection between the contact metal and the wiring layer can be securely achieved.

In the light-emitting apparatus as above in an embodiment, preferably, the transparent electrode is larger in size than the light output surface and is connected directly to the whole area of the light output surface. Since the light emitted from the light-emitting device is not shielded by the transparent electrode but emitted to the exterior of the light-emitting apparatus, it is possible to enhance light output efficiency, as compared with the case where the transparent electrode is formed with the same dimension of the light output surface, and to thereby enhance display characteristics of the light-emitting apparatus.

In the light-emitting apparatus as above in an embodiment, the surface, making contact with the transparent electrode, of the contact metal is preferably formed of a noble metal. With the outermost surface of the contact metal formed of a noble metal, it is possible to prevent oxidation of the contact metal in the region of contact with the transparent electrode. This makes it possible to prevent the trouble that the contact metal might be deteriorated due to corrosion with the result of an increase in electric resistance thereof.

In the light-emitting apparatus as above in an embodiment, the surface, making contact with the transparent electrode, of the wiring layer is preferably formed of a noble metal. With the outermost surface of the wiring layer formed of a noble metal, it is possible to prevent oxidation of the wiring layer in the region of contact with the transparent electrode. This makes it possible to prevent the trouble that the wiring layer might be deteriorated due to corrosion with the result of an increase in electric resistance thereof.

Preferably, the light-emitting apparatus in an embodiment as above further includes a protective resin layer so formed as to cover the transparent electrode. With the protective resin layer so provided as to cover the transparent electrode, it is possible to prevent the transparent electrode from being deformed or deteriorated.

Preferably, the light-emitting apparatus in an embodiment as above further includes a diffusion preventive layer for preventing mutual diffusion of a component of the protective resin layer and a component of the transparent electrode, between the protective resin layer and the transparent electrode. With a resin sheet as the diffusion preventive layer sandwiched between the transparent electrode and the protective resin layer, it is possible to prevent mutual diffusion of components between the transparent electrode and the protective resin film, and to prevent the conductivity of the transparent electrode from being deteriorated.

In accordance with a tenth aspect of the present invention in an embodiment, there is provided a method of manufacturing a light-emitting apparatus, including the steps of transferring a light-emitting device main body having a light output surface onto a resin portion so as to expose the light output surface, forming an electrode separation wall on the surface of the resin portion, providing the electrode separation wall with an opening portion larger in size than the light output surface so that the opening portion fronts on the light output surface, forming a wiring layer on the surface of the resin portion in the inside of the opening portion, and forming a transparent electrode in the opening portion so that the transparent electrode is connected directly to a contact metal formed on the light output surface and to the wiring layer. With the transparent electrode so formed as to cover the contact metal and the wiring layer, it is possible to securely achieve electrical connection between the contact metal and the wiring layer. In addition, since it is unnecessary to form the wiring layer in contact with the contact metal, it is possible to lower the positioning accuracy in forming the wiring layer and to enhance operating efficiency, as compared with the case of forming the wiring layer in contact with the contact metal, which is minute in size.

In the method of manufacturing a light-emitting apparatus as above in an embodiment, the wiring layer is preferably formed outside the region of the light output surface. With the wiring layer formed outside the region of the light output surface, it is possible to reduce the amount of light shielded by the wiring layer, of the light emitted from the light-emitting device, to enhance light output efficiency, and to perform an image display with good display characteristics.

In the method of manufacturing a light-emitting apparatus as above in an embodiment, preferably, after a transparent electrode material is applied so as to cover the opening portion and the electrode separation wall and hardened, the transparent electrode material is polished to expose the surface of the electrode separation wall, thereby forming the transparent electrode. When an ITO ink as the transparent electrode material is applied, hardened, and polished to form the transparent electrode through the Damascene process, it is possible to increase the thickness of the transparent electrode up to about the electrode separation wall. Therefore, it is possible to easily cope with not only the positioning accuracy in the horizontal directions in a pixel but also a positional stagger in the height direction generated in embedding the light-emitting device, and to easily secure electrical connection between a transparent electrode layer and the contact metal.

In the method of manufacturing a light-emitting apparatus as above in an embodiment, the transparent electrode may be formed by jetting a transparent electrode material to the opening portion by an ink jet technique and hardening the transparent electrode material. With a minute amount of the ITO ink as the transparent electrode material applied by the ink jet technique, it is possible also to prevent laminating a transparent electrode layer on the electrode separation wall by regulating the quantity of the ITO ink applied, and to easily form the transparent electrode.

In the method of manufacturing a light-emitting apparatus as above in an embodiment, the transparent electrode may be formed by applying a transparent electrode material to the opening portion by screen printing and hardening the transparent electrode material. With the ITO ink as the transparent electrode material applied by screen printing, the transparent electrode can be formed easily.

In the method of manufacturing a light-emitting apparatus as above in an embodiment, preferably, a plurality of the light-emitting device main bodies are transferred onto the resin portion, and the transparent electrode is formed collectively so as to cover the contact metals formed on the light output surfaces of a plurality of light-emitting devices. With the plurality of contact metals covered collectively by the transparent electrode, it is possible to secure electrical connection between the wiring layer and the contact metals, and to enhance operating efficiency.

In the method of manufacturing a light-emitting apparatus as above in an embodiment, the wiring layer is preferably formed by forming a metallic layer in the inside of the opening portion, and thereafter laminating a noble metal layer on the metallic layer. With the outermost surface of the wiring layer formed of a noble metal, it is possible to prevent oxidation of the wiring layer in the region of contact with the transparent electrode. This makes it possible to prevent the trouble that the wiring layer might be deteriorated due to corrosion with the result of an increase in electric resistance thereof.

The method of manufacturing a light-emitting apparatus as above may further include a step of forming a protective resin layer for protecting the transparent electrode so as to cover the transparent electrode in an embodiment. With the protective resin layer provided so as to cover the transparent electrode, it is possible to prevent the transparent electrode from being deformed or deteriorated.

Further, the method of manufacturing a light-emitting apparatus as just mentioned may further include in an embodiment a step of forming a diffusion preventive layer for preventing mutual diffusion of a component of the protective resin layer and a component of the transparent electrode, on the surface of the transparent electrode. With a resin sheet as the diffusion preventive layer sandwiched between the transparent electrode and the protective resin film, it is possible to prevent mutual diffusion of components between the transparent electrode and the protective resin layer, and to prevent the conductivity of the transparent electrode from being deteriorated.

In accordance with an eleventh aspect of the present invention in an embodiment, there is provided an image display apparatus including an image display surface formed by arranging a plurality of light-emitting apparatuses on an apparatus substrate, each of the light-emitting apparatuses including: a plurality of light-emitting devices each of which includes a light-emitting device main body having a light output surface and transferred, and a contact metal formed on the light output surface; a wiring layer formed outside the regions of the light output surfaces; and a transparent electrode so formed as to cover the contact metals and the wiring layer. With the transparent electrode so formed as to cover the contact metals and the wiring layer, electrical connection between the contact metals and the wiring layer can be securely achieved. In addition, since it is unnecessary to form the wiring layer in contact with the contact metals, it is possible to lower the positioning accuracy in forming the wiring layer, as compared with the case of forming a wiring layer in contact with the minute contact metals, and thereby to enhance operating efficiency.

In accordance with a twelfth aspect of the present invention in an embodiment, there is provided a method of manufacturing an image display apparatus including the steps of transferring a plurality of light-emitting device main bodies each having a light output surface onto a resin portion so as to expose the light output surfaces, forming an electrode separation wall on the surface of the resin portion, providing the electrode separation wall with an opening portion larger in size than the light output surfaces so that the opening portion fronts on the light output surfaces, forming a wiring layer on the surface of the resin portion in the inside of the opening portion, and forming a transparent electrode in the opening portion so that the transparent electrode is connected directly to contact metals formed on the light output surfaces and to the wiring layer.

As has been described above, according to the light-emitting device of the present invention in an embodiment, it is possible to obtain a light-emitting device in which an electrode is securely connected to a light-emitting device main body even where the light-emitting device main body is minute in size, without lowering the light output efficiency of light generated in the light-emitting device main body. Namely, in the case of a minute light-emitting device, the light-emitting device and an electrode can be securely connected to each other by forming a transparent electrode larger as compared with the size of the light-emitting device, without conducting accurate alignment relative to an electrode formation region such as a light output surface of the light-emitting device. Further, with such a transparent electrode, even where the wide range of the light output surface is covered directly by the electrode, light output efficiency can be enhanced as compared with the case of forming a metallic electrode opaque to light.

In addition, by use of light-scattering conductive particulates contained in the transparent electrode formed so as to cover the light output surface in an embodiment, the light emitted from the light-emitting device main body can be diffused to a wide range. Therefore, even if the light-emitting device is minute in size, the light-emitting device can have a large apparent light emission surface. Further, with the transparent electrode formed of a material having a refractive index lower than the refractive index of the light-emitting device main body and with a resin layer lower in refractive index than the transparent electrode formed on the transparent electrode, light output efficiency can be enhanced as compared with the case where the resin layer is formed directly on the light-emitting device main body.

Besides, the light-emitting apparatus according to the present invention in an embodiment ensures that an electrode can be securely formed for a plurality of light-emitting devices. Further, also in the case where the light-emitting apparatus is produced by arranging a plurality of light-emitting devices, an electrode can be formed collectively, instead of forming respective electrodes for the individual light-emitting devices. Moreover, an electrode can be formed easily and securely even in the case where the accuracy of alignment between the light-emitting devices and the electrode is insufficient.

According to the method of manufacturing a light-emitting device of the present invention in an embodiment, even where the reduction in the size of the light-emitting device is advanced, the formation of a transparent electrode so as to directly cover the whole area of the light output surface makes it possible to securely form the transparent electrode for each of the light-emitting devices and to provide a light-emitting device having high reliability.

Furthermore, in the image display apparatus according to the present invention in an embodiment, even where pixels are formed by arranging a multiplicity of minute light-emitting devices, a transparent electrode is securely formed without lowering the light output efficiency of each device. Therefore, it is possible to provide an image display apparatus high in image quality and reliability.

Besides, according to the method of manufacturing an image display apparatus of the present invention in an embodiment, it is possible to securely form a transparent electrode for minute light-emitting devices, and to manufacture an image display apparatus on which the cost-basis merit arising from the manufacture of minute light-emitting devices and the merit of an enhanced image quality are reflected sufficiently.

A transparent electrode is connected directly to light output surfaces so as to cover the whole areas of the light output surfaces. The transparent electrode is formed to be larger in area than the light output surfaces, and are securely electrically connected to n-type semiconductor layers including the light output surfaces. Namely, even where the light-emitting diodes are minute in size, the n-type semiconductor layers and the transparent electrode are securely connected to each other. As a result, the transparent electrode is formed for the light-emitting diodes more securely as compared to the case where it is difficult to accurately form the transparent electrode smaller in size than the light output surfaces in the light output surfaces, and the lights generated in the light-emitting diodes can be outputted to the exterior of the devices without being shielded.

Additional features and advantages of the present invention are described in, and will be apparent from, the following Detailed Description of the Invention and the figures.

BRIEF DESCRIPTION OF THE FIGURES

FIGS. 5A to 5D are step diagrams showing the manufacturing steps of a light-emitting device according to an embodiment of the present invention, in which FIG. 5A is a diagram showing a step of disposing the light-emitting device on a substrate, FIG. 5B is a diagram showing a step of forming a resist film, FIG. 5C is a diagram showing a step of applying an electrode paste, and FIG. 5D is a diagram showing a step of forming a transparent electrode.

FIGS. 6A to 6D are schematic diagrams showing a preferable method of arranging light-emitting devices, which is suitable for a method of manufacturing an image display apparatus according to an embodiment of the present invention.

FIG. 7 is a sectional step diagram showing a first transfer step in the method of manufacturing an image display apparatus according to an embodiment of the present invention.

FIG. 8 is a sectional step diagram showing an electrode pad forming step in the manufacturing method according to an embodiment of the present invention.

FIGS. 12A and 12B show the structure of a light-emitting apparatus corresponding to one pixel in an image display apparatus according to a second embodiment of the present invention, in which FIG. 12A is a sectional view, and FIG. 12B is a plan view.

FIGS. 13A and 13B illustrate a step in the method of manufacturing an image display apparatus according to the second embodiment, showing the condition where alignment marks are formed on an embedding substrate, in which FIG. 13A is a sectional view, and FIG. 13B is a plan view.

FIGS. 14A and 14B illustrate a step in the method of manufacturing an image display apparatus according to the second embodiment, showing the condition where an embedding resin layer is formed, in which FIG. 14A is a sectional view, and FIG. 14B is a plan view.

FIGS. 15A and 15B illustrate a step in the method of manufacturing an image display apparatus according to the second embodiment, showing the condition where the embedding resin layer is partially hardened to form separation walls, in which FIG. 15A is a sectional view, and FIG. 15B is a plan view.

FIGS. 16A and 16B illustrate a step in the method of manufacturing an image display apparatus according to the second embodiment, showing the step of selectively transferring light-emitting devices arranged on a transfer substrate onto a relay substrate, in which FIG. 16A is a sectional view, and FIG. 16B is a plan view.

FIGS. 17A and 17B illustrate a step in the method of manufacturing an image display apparatus according to the second embodiment, showing the step of embedding a light-emitting device into an embedding resin layer, in which FIG. 7A is a sectional view, and FIG. 17B is a plan view.

FIGS. 18A and 18B illustrate a step in the method of manufacturing an image display apparatus according to the second embodiment, showing the step of hardening the embedding resin layer with the light-emitting device embedded therein to form device holding resin layers, in which FIG. 18A is a sectional view, and FIG. 18B is a plan view.

FIGS. 19A and 19B illustrate a step in the method of manufacturing an image display apparatus according to the second embodiment, showing the condition where red, green, and blue light-emitting devices are embedded in one pixel, in which FIG. 19A is a sectional view, and FIG. 19B is a plan view.

FIGS. 20A and 20B illustrate a step in the method of manufacturing an image display apparatus according to the second embodiment, showing the condition where electrode separation walls are formed on the device holding resin layers, in which FIG. 20A is a lateral sectional view, and FIG. 20B is a plan view.

FIGS. 21A and 21B illustrate a step in the method of manufacturing an image display apparatus according to the second embodiment, showing the condition where a light emission side wiring layer is formed on the device holding resin layers, in which FIG. 21A is a lateral sectional view, and FIG. 21B is a plan view.

FIGS. 22A and 22B illustrate a step in the method of manufacturing an image display apparatus according to the second embodiment, showing the condition where a transparent electrode layer is formed so as to cover the light emission side wiring layers and the electrode separation walls, in which FIG. 22A is a lateral sectional view, and FIG. 22B is a plan view.

FIGS. 23A and 23B illustrate a step in the method of manufacturing an image display apparatus according to the second embodiment, showing the condition where the electrode separation walls are exposed by polishing the transparent electrode layer, in which FIG. 23A is a lateral sectional view, and FIG. 23B is a plan view.

FIGS. 24A and 24B illustrate a step in the method of manufacturing an image display apparatus according to the second embodiment, showing the condition where a protective resin layer is formed on the transparent electrode layer and the electrode separation walls, in which FIG. 24A is a lateral sectional view, and FIG. 24B is a plan view.

FIGS. 25A and 25B illustrate a step in the method of manufacturing an image display apparatus according to the second embodiment, showing the condition where a display substrate is adhered, in which FIG. 25A is a lateral sectional view, and FIG. 25B is a plan view.

FIGS. 26A and 26B illustrate a step in the method of manufacturing an image display apparatus according to the second embodiment, showing the step of exfoliating the embedding substrate by laser ablation, in which FIG. 26A is a sectional view, and FIG. 26B is a plan view.

FIGS. 27A and 27B illustrate a step in the method of manufacturing an image display apparatus according to the second embodiment, showing the step of etching the device holding resin layer to expose bumps, in which FIG. 27A is a sectional view, and FIG. 27B is a plan view.

FIGS. 28A and 28B illustrate a step in the method of manufacturing an image display apparatus according to the second embodiment, showing the step of forming a backside resin layer and vias, in which FIG. 28A is a sectional view, and FIG. 28B is a plan view.

FIGS. 29A and 29B illustrate a step in the method of manufacturing an image display apparatus according to the second embodiment, showing the step of opening a lead via outside the pixel region, in which FIG. 29A is a sectional view, and FIG. 29B is a plan view.

FIGS. 30A and 30B illustrate a step in the method of manufacturing an image display apparatus according to the second embodiment, showing the step of forming a wiring layer and a lead pad, in which FIG. 30A is a sectional view, and FIG. 30B is a plan view.

DETAILED DESCRIPTION OF THE INVENTION

Figure 1:
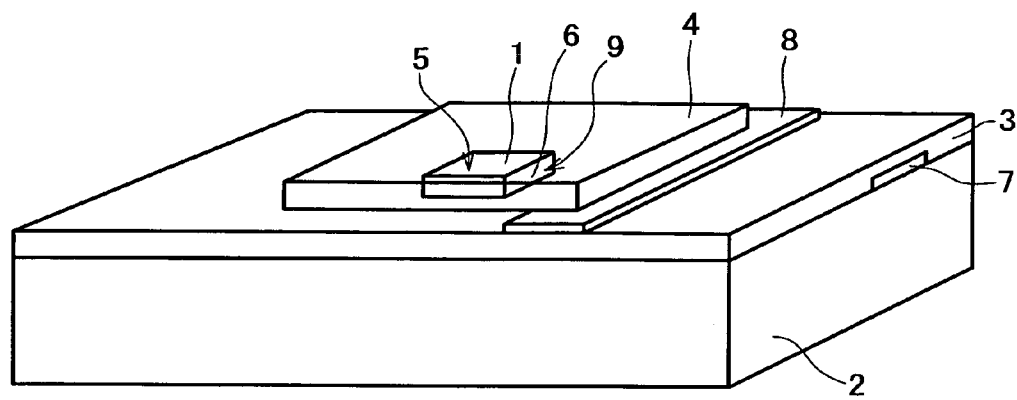
FIG. 1 is a perspective view showing the condition where a light-emitting device according to an embodiment of the present invention is disposed on a substrate.

The present invention relates to a light-emitting device, a light-emitting apparatus, an image display apparatus, a method of manufacturing a light-emitting device, and a method of manufacturing an image display apparatus. More particularly, the present invention relates to a light-emitting device, a light-emitting apparatus, an image display apparatus, a method of manufacturing a light-emitting device, and a method of manufacturing an image display apparatus in which light emission efficiency is prevented from being lowered and an electrode is formed for minute light-emitting device main bodies with high accuracy.

Now, a light-emitting device, a light-emitting apparatus, an image display apparatus, a method of manufacturing a light-emitting device, and a method of manufacturing an image display apparatus according to the present invention will be described below, referring to the drawings.

First Embodiment

First, referring to FIGS. 1 and 2, an example of the light-emitting device according to the present invention will be described. While a light-emitting diode will be taken as an example of the light-emitting device in the description of this example, the light-emitting device according to the present invention is not limited to the light-emitting diode. FIG. 1 is a perspective view showing the condition where a light-emitting diode 1 is disposed on a substrate 2, and FIG. 2 is a sectional view showing the condition where the light-emitting diode 1 is disposed on the substrate 2.

Figure 2:
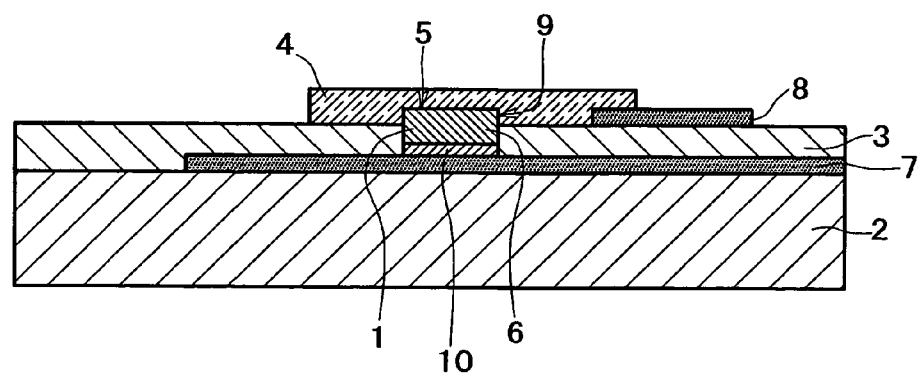
FIG. 2 is a sectional view showing the condition where the light-emitting device is disposed on the substrate according to an embodiment of the present invention.

As shown in FIGS. 1 and 2, the light-emitting diode 1 is disposed in the state of being fixed to an insulation resin layer 3 formed on the substrate 2, and a transparent electrode 4 is formed directly so as to cover a light output surface 5.

The light-emitting diode 1 is so disposed that an n-type semiconductor layer 6 made to be of the n-type conduction type by doping with an impurity is fixed to the insulation resin layer 3 so as to be exposed from the insulation resin layer 3. The insulation resin layer 3 is formed on the substrate 2, on which a wiring 7 to be connected to the light-emitting diode 1 has previously been formed, and the light-emitting diode 1 is fixedly disposed so as to be connected to the wiring 7. In forming the insulation resin layer 3 after fixingly disposing the light-emitting diode 1 onto the substrate 2, it suffices to remove the insulation resin layer 3 so as to expose the n-type semiconductor layer 6, by etching or the like. While the substrate 2 in this example is an apparatus substrate of an image display apparatus formed by arranging the light-emitting diodes 1, the substrate 2 may be a transfer substrate for temporary transfer of the light-emitting diode(s) 1. The top surface of the n-type semiconductor layer 6 exposed from the insulation resin layer 3 of the light-emitting diode 1 is made to be the light output surface 5, and light generated in the light-emitting diode 1 is emitted to the upper side in the figures.

The light-emitting diode 1 is in the form of a chip, and is made to be a homo-type light-emitting diode or a hetero-type light-emitting diode in which an n-type semiconductor layer and a p-type semiconductor layer are laminated. In this case, the light-emitting diode 1 is not limited to a light-emitting diode having the structure in this example, and may be a light-emitting diode formed by selecting a desired device structure and materials so that it can respectively emit light with one of various wavelengths such as blue, green, yellow, red, infrared, etc. Besides, the light-emitting diode 1 may be a light-emitting diode enhanced in light emission efficiency by forming a double hetero structure or quantum well structure in which an active layer is sandwiched between a p-type clad layer and an n-type clad layer. While the light-emitting diode 1 in this example is a light-emitting diode roughly flat plate-like in shape, the light-emitting diode may be a light-emitting diode in which the lamination direction of the semiconductor layer is inclined against the major surface of the device forming substrate. For example, the shape of the light-emitting diode is not limited to the roughly flat plate-like shape, and may have any device shape such as the sectional shape of the device is tapered and the outside shape of the device is a hexagonal pyramid. Furthermore, the light-emitting device according to the present invention is not limited to the light-emitting diode, and may be such a light-emitting device as a semiconductor laser device.

The transparent electrode 4 is connected directly to the light output surface 5 so as to cover the whole area of the light output surface 5. Further, the transparent electrode 4 is formed to be larger in size than the light output surface 5, and is securely electrically connected to the n-type semiconductor layer 6 including the light output surface 5. Namely, even where the light-emitting diode 1 is minute in size, assured connection between the n-type semiconductor layer 6 and the transparent electrode 4 is achieved. Therefore, electrical connection between the n-type semiconductor layer 6 and the transparent electrode 4 can be performed securely, as compared with the case where it is difficult for the transparent electrode smaller in size than the light output surface 5 to be accurately formed in the region of the light output surface 5. In addition, since the transparent electrode 4 is larger in size than the light output surface 5, even in the case where the position of the transparent electrode 4 is staggered from the position of the light-emitting diode 1, the electrical connection between the light-emitting diode 1 and the transparent electrode 4 is attained inasmuch as the light-emitting diode 1 is disposed in the region where the transparent electrode 4 is formed.

Besides, the transparent electrode 4 is formed to be greater in size than the light output surface 5, thereby providing direct connection between a wiring 8 formed on the surface of the insulation resin layer 3 and the light-emitting diode 1. Therefore, a device main body of the light-emitting diode 1 and the wiring 8 can be connected to each other without performing an intricate step, as contrasted to the case where an electrode is formed on the light output surface 5, and Further, the electrode and the wiring 8 are connected to each other through a connection wire. Particularly, as the light-emitting diode 1 becomes minuter in size, it becomes more difficult to form the electrode and the connection wire in predetermined regions in predetermined sizes. In view of this, according to the transparent electrode 4 formed as in this example, the light-emitting diode 1 and the wiring 8 can be easily connected without any restriction by the size of the light-emitting diode 1.

Further, as an example, the transparent electrode 4 is formed by coating the whole area of the light output surface 5 with a paste containing conductive particulates dispersed in a light-transmitting resin. The conductive particulates are formed, for example, of a light-transmitting and conductive material such as Indium Tin Oxide (ITO), and those which are in a needle shape promising easy scattering of light can be used. When such a transparent electrode 4 is used, the transparent electrode 4 can be connected not only to the light output surface 5 but also to side surfaces 9 of the n-type semiconductor layer 6, in the case where the light-emitting diode 1 is so disposed that the n-type semiconductor layer 6 protrudes from the insulation resin layer 3 as in this example. Further, the light going from the light-emitting diode 1 into the transparent electrode 4 can be scattered by the conductive particulates, thereby emitting the light while diffusing the light to a wide range in the exterior of the device. Thus, with the conductive particulates contained in the transparent electrode 4, the light-emitting diode 1 can have an apparent light emission area larger than the actual size thereof, so that a light-emitting device preferable for use in a light-emitting apparatus or an image display apparatus can be obtained even where the light-emitting diode is minute in size.

In addition, where the n-type semiconductor layer 6 protrudes from the insulation resin layer 3 as in this example, both the light output surface 5 and the side surfaces 9 are connected to the transparent electrode 4, so that it is possible to secure a large area of contact between the transparent electrode 4 and the light-emitting diode 1. Particularly, as the size of the light-emitting diode 1 becomes a minute size of about several tens of micrometers, the ratio of the area of the side surfaces 9 to the area of the n-type semiconductor layer 6 to be connected to the transparent electrode 4 increases. Therefore, if the connection to the transparent electrode 4 can be secured through the side surfaces 9, the electric resistance in the connection region can be reduced, and the light-emitting diode 1 can be made to be a light-emitting device with high reliability. Besides, a contact layer formed of a metallic material such as Ti may be preliminarily formed on the side surfaces 9. With such a contact layer, it is possible to enhance the performance of contact between the n-type semiconductor layer 6 and the transparent electrode 4, and the light-emitting diode 1 can be made to be a light-emitting device with a further higher reliability.

The p-type semiconductor layer 10 is connected to the wiring 7, which is formed on the surface of the substrate 2 and so disposed on the substrate 2 as to be covered by the insulation resin layer 3. While the p-type semiconductor layer 10 is connected directly to the wiring 7 in this example, the n-type semiconductor layer 6 may be connected to the wiring 7. In that case, the transparent electrode 4 is formed on the whole area of the p-type semiconductor layer 10, and the top face of the p-type semiconductor layer 10 constitutes the light output surface.

Figure 3:
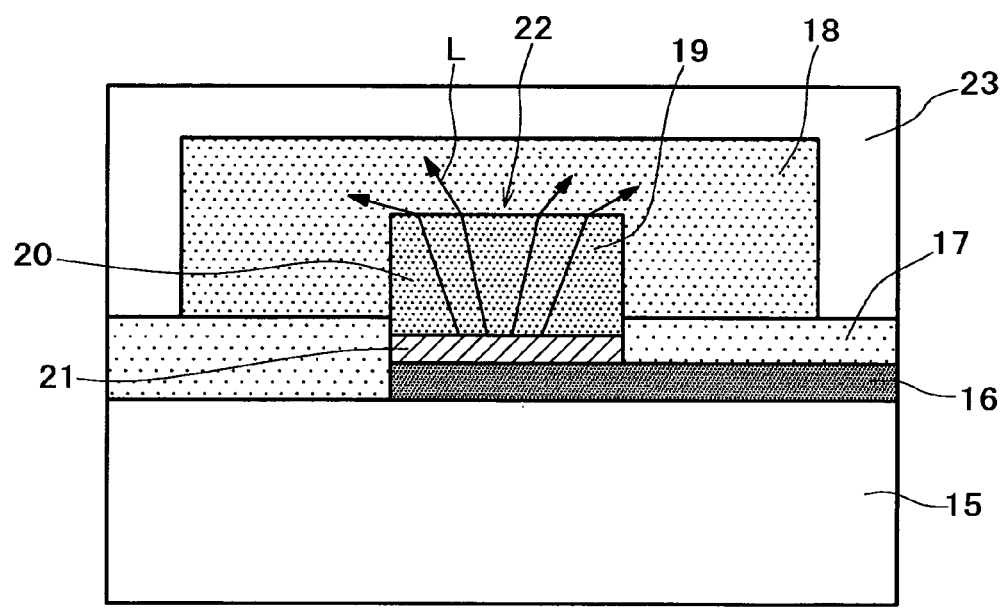
FIG. 3 is a sectional view showing another example of the light-emitting device according to an embodiment of the present invention.

Next, referring to FIG. 3, another example of the light-emitting device according to an embodiment of the present invention will be described. The light-emitting device in this example is a light-emitting diode 19 having a device structure similar to that of the light-emitting diode described above referring to FIGS. 1 and 2. A p-type semiconductor layer 21 is connected to a wiring 16 formed on a substrate 15. A transparent electrode 18 is formed of a material having a refractive index lower than that of an n-type semiconductor layer 20 having a light output surface 22. Such a transparent electrode 18 can be formed of a light-transmitting material by a film forming method such as sputtering and vacuum vapor deposition. For example, where the light-emitting diode 19 is composed of a GaN-based semiconductor, the n-type semiconductor layer 20 has a refractive index of about 2.4, whereas an ITO film constituting a bulk with a refractive index of about 2.0 is formed as the transparent electrode 18 directly on the light output surface 22. Further, a resin layer 23 having a refractive index of about 1.5 to 1.6 can be formed on the upper side of the transparent electrode 18 as an overcoat layer of the light-emitting diode 19. Therefore, where the light-emitting diode 19 is made to emit light in air whose refractive index is about 1.0, the transparent electrode 18 has a refractive index between the refractive index of the light-emitting diode 19 and the refractive index of the resin layer 23 covering the light-emitting diode 19, whereby the light reflected at the interface between the light output surface 22 and the resin layer 23 can be reduced, as compared to the case where a resin layer is formed directly on the light output surface 22. Therefore, it is possible to enhance light emission efficiency to the exterior of the device. In addition, by coating the whole area of the light output surface with a paste containing ITO particulates dispersed in a light-transmitting resin, it is possible to form a transparent electrode whose refractive index is lower than the refractive index of the device main body of the light-emitting diode 19 and higher than the refractive index of the resin layer 23. In such a transparent electrode, the light output efficiency can be further enhanced by, for example, admixing the resin with titanium oxide particulates whose refractive index is higher than the refractive index of the GaN-based semiconductor layer.

Figure 4:
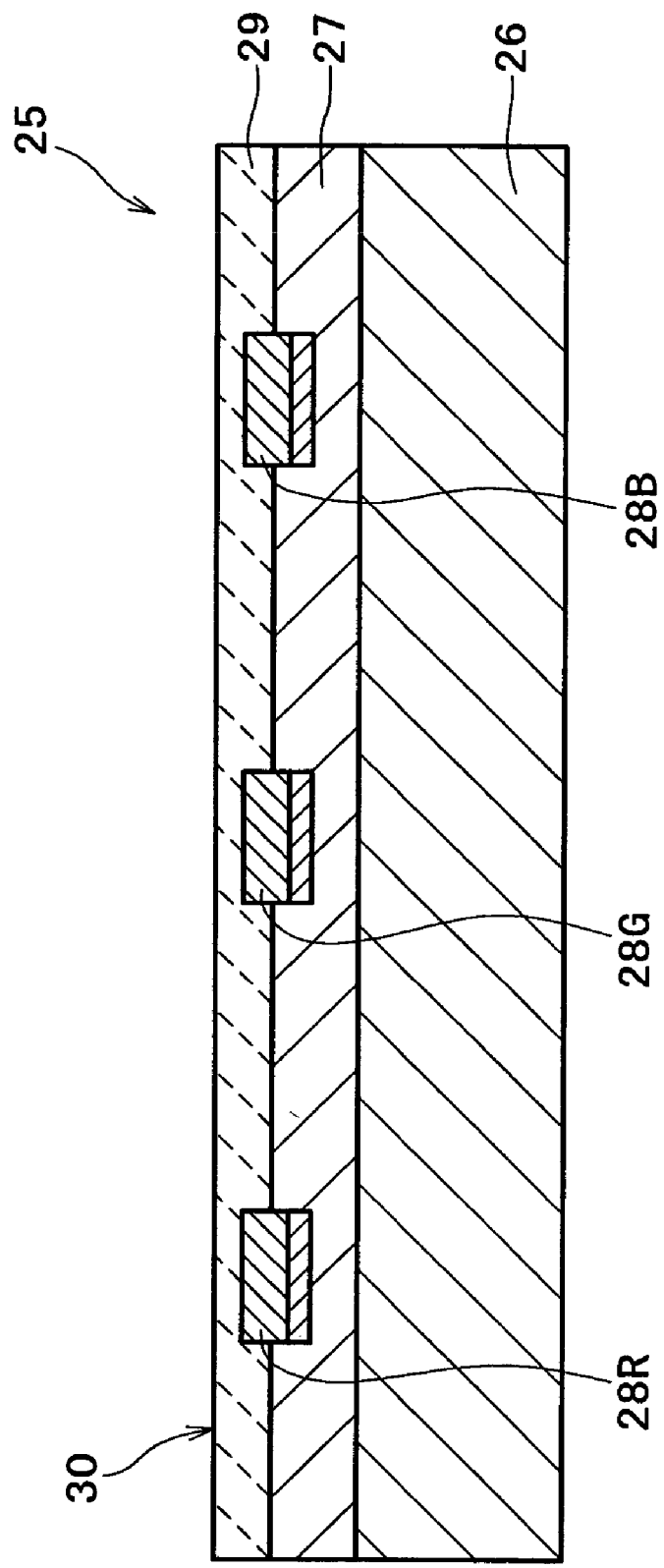
FIG. 4 is a sectional view showing the structure of a light-emitting apparatus according to the present invention.

Next, an example of the light-emitting apparatus according to an embodiment of the present invention will be described. FIG. 4 is a sectional view showing the configuration of the light-emitting apparatus according to this example. As shown in FIG. 4, the light-emitting apparatus 25 includes light-emitting diodes 28R, 28G, 28B disposed at a predetermined device interval in an insulation resin layer 27 formed on a substrate 26. The light-emitting diodes 28R, 28G, 28B are respectively a red light-emitting diode, a green light-emitting diode, and a blue light-emitting diode, which emit light in three primary colors, respectively. These light-emitting diodes are provided as a set, to constitute the light-emitting apparatus 25. The light-emitting diodes 28R, 28G, 28B are formed in a size of about 10 μm square, for example. The surfaces, exposed from the insulation resin layer 27, of the light-emitting diodes 28R, 28G, 28B are made to be light output surfaces of the light-emitting diodes, and a transparent electrode 29 is directly formed so as to cover the whole areas of the light output surfaces. Specifically, by forming the transparent electrode 29 in a size of about 100 μm square, it is possible to directly cover the whole part of the region where the light-emitting diodes 28R, 28G, 28B are disposed, even where the device interval is sufficiently large. Therefore, the transparent electrode 29 is formed collectively, instead of forming electrodes individually for the minute light-emitting devices of about 20 μm square in size. With the transparent electrode 29 thus formed in a size larger than the device size of the light-emitting diodes 28R, 28G, 28B, i.e., the size of the light output surfaces of the devices, it is possible to easily connect the transparent electrode to the light output surface of each device inasmuch as each device is disposed in the region where the transparent electrode 29 is formed. Besides, in this example, the transparent electrode 29 is formed collectively on the light output surfaces of the light-emitting diodes 28R, 28G, 28B so as to constitute a common electrode in driving each of the light-emitting diodes. In addition, the respective devices are individually driven by electric power supplied through wirings separately connected to the light-emitting diodes 28R, 28G, 28B.

The transparent electrode 29 is formed from a light-transmitting conductive material such as ITO by a film forming method such as sputtering and vacuum vapor deposition; more preferably, the transparent electrode 29 may be formed by applying an electrode paste containing conductive particulates dispersed in a light-transmitting resin. By use of such a transparent electrode containing the conductive particulates, the light emitted from the light-emitting diodes 28R, 28G, 28B can be emitted while being diffused from a light emission surface 30 of the light-emitting apparatus 25. Therefore, according to the light-emitting apparatus 25 of this example, the light emission surface 30 can be a light emission surface with a large apparent light emission surface. According to such a light-emitting apparatus 25, the light in red, green, and blue colors can be emitted to a wide range, whereby it is possible to configure a light-emitting apparatus having a large apparent light emission surface, as compared with the actual size of the light-emitting diodes 28R, 28G, 28B, and a sufficient luminance.

Figure 5A:
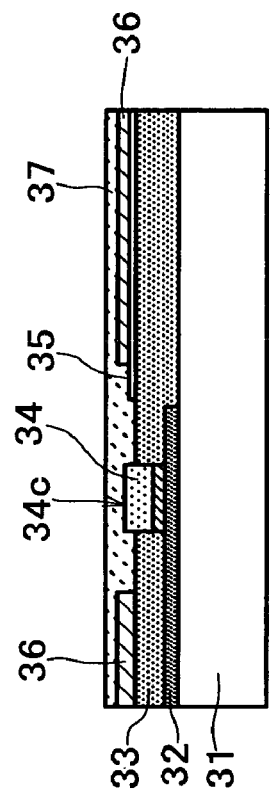

Next, referring to FIGS. 5A to 5D, a method of manufacturing a light-emitting device according to the present invention will be described, taking the light-emitting diode as an example. First, as shown in FIG. 5A, a wiring 32 is formed on a substrate 31, and a light-emitting diode 34 is transferred onto the substrate 31 so that a p-type semiconductor layer 34b is connected to the wiring 32. Further, an insulation resin layer 33 is formed so as to cover the substrate 31, the wiring 32, and the light-emitting diode 34. The insulation resin layer 33 is selectively removed so as to expose a light output surface 34c of the light-emitting diode 34 from the insulation resin layer 33. The selective removal of the insulation resin layer 33 can be conducted, for example, by sandblasting, ashing, or the like. Furthermore, the insulation resin layer 33 may be so removed as to expose the side surfaces of an n-type semiconductor layer 34a including the light output surface 34c of the light-emitting diode 34. In addition, a wiring 35 to be connected to the light-emitting diode 34 in the latter step for driving the light-emitting diode 34 is preliminarily formed on the surface of the insulation resin layer 33 after the selective removal of the insulation resin.

Figure 5B:
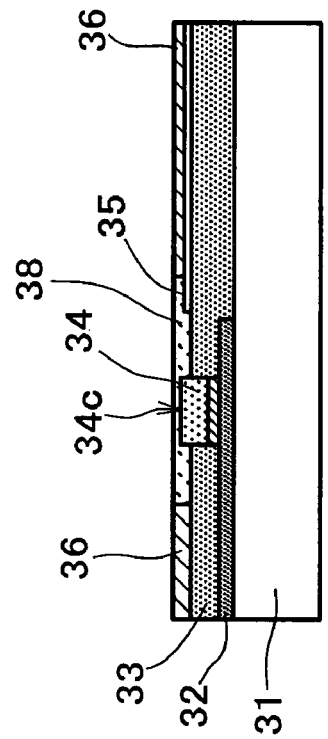

Subsequently, as shown in FIG. 5B, an electrode pattern is formed. A resist film 36 is formed so as to cover both the surface of the insulation resin layer 33 after the selective removal of the insulation resin and the light-emitting diode 34 exposed from the insulation resin layer 33. For example, a photoresist film as the resist film is formed, followed by exposure and development, whereby an opening portion 36a defining the shape of the electrode pattern is formed. The opening portion 36a is formed by removing the resist film 36 so as to expose the whole part of the light output surface 34c of the light-emitting diode 34. Besides, in this example, the opening portion 36a is so formed as to expose also the wiring 35.

Figure 5C:
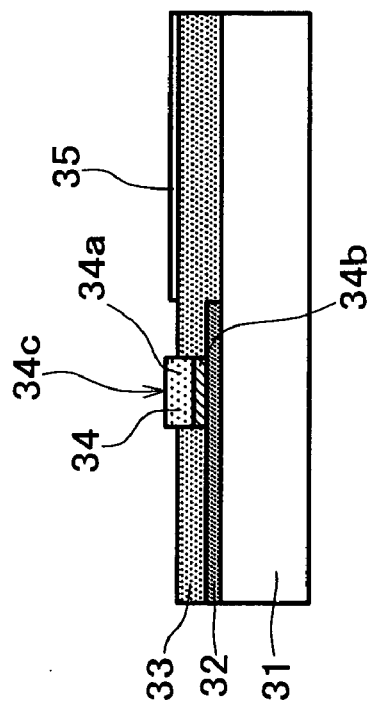

Subsequently, as shown in FIG. 5C, an electrode paste is applied into the opening portion 36a and onto the surface of the resist film 36, to form a transparent electrode layer 37. As the electrode paste for forming the transparent electrode layer 37, a paste containing conductive particulates dispersed in a light-transmitting resin can be used. Besides, the electrode forming material is not limited to the electrode paste used in this example; for example, a resin, which is conductive by itself, may be used as the material. The electrode paste is applied to the light output surface 34c of the light-emitting diode 34 and the wiring 35, which front on the opening portion 36a, so that the light output surface 34c and the wiring 35 are connected to each other collectively through the transparent electrode layer 37.

Figure 5D:
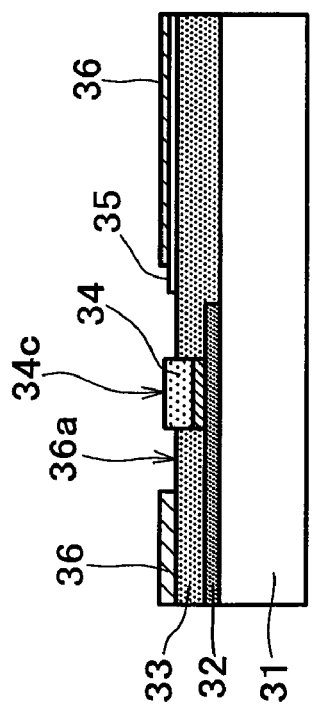

Furthermore, as shown in FIG. 5D, the transparent electrode layer 37 formed on the resist film 36 is removed, to leave the transparent electrode 38 only in the opening portion 36a. The transparent electrode layer 37 formed on the surface of the resist film 36 can be removed, for example, by a removing method such as polishing by use of fixed abrasive grains or free abrasive grains, sandblasting, ashing, etc. By forming the transparent electrode 38 in this manner, the transparent electrode 38 is connected also to the side surfaces of the light-emitting diode 34 protruding from the insulation resin layer 33, whereby the connection between the light-emitting diode 34 and the transparent electrode 38 can be securely achieved.

Particularly, in the case where a step is generated between the surface of the insulation resin layer 33 and the light output surface 34c of the light-emitting diode 34 protruding from the insulation resin layer 33, the formation of the transparent electrode 38 in the above-mentioned manner makes it possible to enhance the performance of contact between the transparent electrode 38 and the light-emitting diode 34, as compared with the case of forming an electrode film from a transparent electrode material such as ITO by sputtering or vacuum vapor deposition.

Further, according to the method of manufacturing a light-emitting device of the present invention in an embodiment, the transparent electrode 38 is formed on the light output surface 34c of the light-emitting diode 34, whereby the transparent electrode 38 can be securely connected to the light output surface 34c even where the light-emitting diode 34 is a minute light-emitting device with a size of about 10 μm square, and the light output efficiency to the exterior of the device is little lowered. Namely, with the opening portion 36a formed to be larger in size than the light output surface 34c of the light-emitting diode 34, the transparent electrode 38 formed in the manner of filling the opening portion 36a and the light output surface 34c are securely connected to each other. Besides, the method of manufacturing a light-emitting device according to the present invention is not limited to that in this example; the electrode paste may also be applied directly to the light output surface of the light-emitting device by a screen printing method using a screen mask provided with an electrode pattern. Incidentally, the method of manufacturing a light-emitting device according to the present invention is preferable also in the case of manufacturing a light-emitting device without performing a transferring step.

Next, an image display apparatus and a method of manufacturing the same according to the present invention will be described. In the following, a method of transferring light-emitting devices will be described first, and then the image display apparatus and the method of manufacturing the same will be described in detail. The method of transferring light-emitting devices according to this example reside in conducting a two-stage pitch-enlarging transfer in which light-emitting devices formed on a first substrate in a high integration degree are transferred onto a temporary holding member so that they are spaced wider apart from each other than they have been on the first substrate, and then the light-emitting devices held on the temporary holding member are transferred onto a second substrate so that they are spaced further wider apart from each other. Incidentally, while the transfer is performed in two stages in this example, a three- or more-stage transfer may also be adopted according to the desired degree of enlargement of device interval.

FIGS. 6A to 6D illustrate basic steps of the two-stage pitch-enlarging transfer method. First, light-emitting devices 40, for example, are densely formed on a first substrate 39a shown in FIG. 6A. By forming the light-emitting devices densely, it is possible to increase the number of the devices produced per substrate, and to lower the product cost. The first substrate 39a is any of various device forming substrates such as a semiconductor wafer, a glass substrate, a quartz glass substrate, a sapphire substrate, a plastic substrate, etc., and the light-emitting devices 40 may be formed directly on the first substrate 39a or may be arranged on the first substrate 39a after being formed on another substrate.

Next, as shown in FIG. 6B, the light-emitting devices 40 are transferred from the first substrate 39a onto a first temporary holding member 39b, and are held on the first temporary holding member 39b, which is shown by a broken line. In this instance, the light-emitting devices 40 are spaced wider apart from each other and arranged in a matrix pattern as shown in the figure. Namely, the light-emitting devices 40 are so transferred that they are spaced wider apart in x-direction and are spaced wider apart in y-direction perpendicular to the x-direction. The device interval after the wider spacing is not particularly limited, and may be, for example, an interval determined taking into account the formation of a resin portion and/or the formation of electrode pads in the subsequent step. At the time of transfer from the first substrate 39a onto the first temporary holding member 39b, all of the light-emitting devices 40 on the first substrate 39a may be transferred so that they are spaced wider apart from each other. In this case, the size of the first temporary holding member 39b must only be not less than the size obtained by multiplying the number (in x-direction and y-direction, respectively) of the light-emitting devices 40 arranged in the matrix pattern by the enlarged interval. Also, some of the light-emitting devices 40 on the first substrate 39a may be transferred onto the first temporary holding member 39b while being spaced wider apart from each other.

After the first transfer step above-described, as shown in FIG. 6C, the light-emitting devices 40 present on the first temporary holding member 39b are spaced apart from each other. In view of this, the covering of the surroundings of the device with a resin and the formation of an electrode pad are performed on the basis of each light-emitting device 40. The covering of the surroundings of the devices with the resin is formed for facilitating the formation of the electrode pads, for facilitating the handling of the devices in the subsequent second transfer step, and the like purposes. The formation of the electrode pads is conducted after the second transfer step followed by the final wiring, as will be described later. Therefore, the electrode pads are formed in a comparatively large size in order to obviate defective wiring. Incidentally, the electrode pads are not shown in FIG. 6C. By covering the surroundings of each light-emitting device 40 with a resin 40a, a resin-potted chip 40b is formed. The light-emitting device 40 is located roughly in the center of the resin-potted chip 40b. However, the light-emitting device 40 may be located at a position deviated from the center toward one side or one corner of the resin-potted chip 40b. Also in that case, an electrode can be securely connected to the light-emitting device 40 by forming a larger electrode pad as compared with the light-emitting device 40.

Next, as shown in FIG. 6D, the second transfer step is carried out. In the second transfer step, the light-emitting devices 40 arranged in the matrix pattern on the first temporary holding member 39b are transferred onto a second substrate 39c so that the devices 40 are spaced further apart from each other on the basis of the resin-potted chips 40b.

In the second transfer step, also, the adjacent light-emitting devices 40 are spaced wider apart from each other on the basis of the resin-potted chips 40b, and are arranged in a matrix pattern as shown in the figure. Namely, the light-emitting devices 40 are transferred while being spaced wider apart from each other in x-direction and in y-direction perpendicular to the x-direction. Assuming that the positions of the devices arranged by the second transfer step correspond to the pixels in a final product such as an image display apparatus, the product obtained by multiplying the original pitch of the light-emitting devices 40 by a roughly integral number is the pitch of the light-emitting devices 40 arranged through the second transfer step. Here, let the magnification factor of the pitch of the light-emitting devices 40 attendant on the transfer from the first substrate 39a onto the first temporary holding member 39b be n and let the magnification factor of the pitch of the light-emitting devices 40 attendant on the transfer from the first temporary holding member 39b onto the second substrate 39c be m, then the value E of the roughly integral number is represented as E=n×m. Wiring is applied to each of the light-transmitting devices 40 spaced wider apart from each other on the basis of the resin-potted chips 40b on the second substrate 39c. In this case, in order to restrain defective connection as securely as possible, the wiring is conducted by utilizing the previously formed electrode pads and the like. Where the light-emitting devices 40 are light-emitting diodes or the like, for example, the wiring includes the wirings to p-electrode and n-electrode.

In the two-stage pitch-enlarging transfer method shown in FIGS. 6A to 6D, the formation of the electrode pads and the potting with a resin can be performed by utilizing the enlarged spaces after the first transfer, and the wiring is conducted after the second transfer. In this case, the wiring is carried out while restraining defective connection as securely as possible, by utilizing the previously formed electrode pads and the like. Therefore, it is possible to enhance the yield of the image display apparatus. In addition, in the two-stage pitch-enlarging transfer method, there are two steps of enlarging the pitch of the devices, and, by performing the pitch-enlarging transfer in a plurality of steps for spacing the devices wider apart from each other, the number of transferring steps is reduced in practice. Namely, for example, let the magnification factor of the pitch attendant on the transfer from the first substrate 39a onto the first temporary holding member 39b be 2 (n=2) and let the magnification factor of the pitch attendant on the transfer from the first temporary holding member 39b onto the second substrate 39c be 2 (m=2), and if the pitch-enlarging transfer should be carried out in a single step, the final magnification factor would be 2×2=4, and there would be need for conducting transfer 16 (=$4^2$) times, i.e., conducting alignment of the first substrate 16 times. On the other hand, in the two-stage pitch-enlarging transfer method according to this example, the number of times of alignment needed is only 8, i.e., the simple sum of 4 (the square of the magnification factor of 2 in the first transfer step) and 4 (the square of the magnification factor of 2 in the second transfer step). In other words, since $(n+m)^2=n^2+2nm+m^2$, in the case of intending the same pitch magnification factor upon transfer, the two-stage pitch-enlarging transfer method according to this example will necessarily reduce the number of times of transfer by 2 nm, as compared with the single-stage pitch-enlarging transfer method. This promises reductions in the time and cost of the manufacturing steps, by amounts corresponding to 2 nm times of transfer, and is particularly profitable where the magnification factor is large.

In the second transfer step as above, the light-emitting devices 40 are transferred from the temporary holding member 39b onto the second substrate 39c while being handled as the resin-potted chips 40b. By configuring such resin-potted chips 40b, the surroundings of the light-emitting devices 40 are flattened by the resin 40a, so that the light-emitting devices 40 and the electrode pads can be securely connected to each other by forming the electrode pads larger in size than the light-emitting devices 40, even where the size of the light-emitting devices 40 are as minute as about 10 μm, for example. As will be described later, the final wiring is conducted after the second transfer step. Therefore, defective wiring can be prevented by conducting the wiring by utilizing the electrode pads, which are comparatively large in size.

Next, referring to FIGS. 7 to 11, an image display apparatus and a method of manufacturing an image display apparatus according to the present invention will be described. In this example, a GaN-based light-emitting diode in the shape of a hexagonal pyramid is used as an example of the light-emitting device.

First, as shown in FIG. 7, a plurality of light-emitting diodes 42 are formed in a matrix pattern on a major surface of a first substrate 41. The light-emitting diodes 42 may be about 10 μm in size. As a constituent material of the first substrate 41, there is used a material having a high transmittance for the wavelength of laser with which the light-emitting diodes 42 are irradiated, such as a sapphire substrate. For each of the light-emitting diodes 42, components up to p-electrode or the like have been formed, but the final wiring has not yet been formed. Grooves 42g for separation between the devices have been formed, so that the individual light-emitting diodes 42 can be separated. The grooves 42g are formed, for example, by reactive ion etching. Such a first substrate 41 is opposed to the first temporary holding member 43, and selective transfer is conducted, as shown in FIG. 8.

A release layer 44 and an adhesive layer 45 in two layers are formed on the surface, opposed to the first substrate 41, of the first temporary holding member 43. As the first temporary holding member 43, for example, a glass substrate, a quartz glass substrate, a plastic substrate, or the like may be used. Examples of the material of the release layer 44 on the first temporary holding member 43 include a fluororesin coat, a silicone resin, a water-soluble adhesive, for example, polyvinyl alcohol (PVA), a polyimide and the like. As the adhesive layer 45 on the first temporary holding member 43, a layer of any of ultraviolet ray (UV)-curable adhesives, thermosetting adhesives, thermoplastic adhesives and the like may be used. As one example, a quartz glass substrate is used as the first temporary holding member 43, a polyimide film 4 μm in thickness is formed as the release layer 44, and thereafter a UV-curable adhesive as the adhesive layer 45 is applied in a thickness of about 20 μm.

The adhesive layer 45 on the first temporary holding member 43 is so conditioned that cured regions 45s and uncured regions 45y are mixedly present, and is so registered that the light-emitting diodes 42 to be selectively transferred are located in the uncured regions 45y. The conditioning for ensuring that the cured regions 45s and the uncured regions 45y are mixedly present may be conducted, for example, by a method in which the UV-curable adhesive is selectively irradiated with UV rays at a pitch of 200 μm by use of an exposure apparatus so that the adhesive is uncured in the regions of transfer of the light-emitting diodes 42 and is cured in the other regions. After such an alignment, the light-emitting diodes 42 at the intended transfer positions are irradiated with laser from the back side of the first substrate 41, and these light-emitting diodes 42 are exfoliated from the first substrate 41 through laser ablation. The GaN-based light-emitting diodes 42 can be exfoliated comparatively easily, since GaN decomposes into metallic Ga and nitrogen at the interface between itself and sapphire. Examples of the laser for irradiation therewith include excimer laser and high-harmonic YAG laser.

By the exfoliation utilizing laser ablation, the light-emitting diodes 42 relevant to the selective irradiation are decomposed at the interface between the GaN layer and the first substrate 41, and are transferred in the manner that p-electrode portions thereof pierces into the adhesive layer 45 on the other side. As for the other light-emitting diodes 42, which are not irradiated with the laser, the corresponding portions of the adhesive layer 45 are the cured regions 45s, and they are not irradiated with the laser, so that the light-emitting diodes 42 are not transferred to the side of the first temporary holding member 43. Incidentally, while only one light-emitting diode 42 is selectively irradiated with laser in FIG. 7, the light-emitting diodes 42 located in the regions spaced apart from the one light-emitting diode 42 by n pitches are also irradiated with the laser in the same manner. By such a selective transfer, the light-emitting diodes 42 are arranged on the first temporary holding member 43 at a pitch greater than the pitch on the first substrate 41.

In the condition where the light-emitting diodes 42 are held by the adhesive layer 45 on the first temporary holding member 43, the back side of each light-emitting diode 42 is the n-electrode side (cathode side), and the back side of the light-emitting diode 42 has been deprived of the resin (adhesive) by removal and cleaning. Therefore, when an electrode pad 46 is formed as shown in FIG. 8, the electrode pad 46 is electrically connected to the back side of the light-emitting diode 42. The back side of the light-emitting diode 42 is made to be a light output surface of the light-emitting diode 42, and the electrode pad 46 is directly formed so as to cover the whole area of the light output surface. In this case, the electrode pad on the cathode side may be about 60 μm square in size. The electrode pad 46 is formed by applying an electrode paste containing conductive particulates dispersed in a light-transmitting resin. Therefore, light emission is not hindered even if the back side of the light-emitting diode 42 is covered by the electrode in a large area, so that a large electrode can be formed. Accordingly, even where the size of the light-emitting diode 42 is about 10 μm square as in this example, the electrode can be formed easily.

Figure 9:
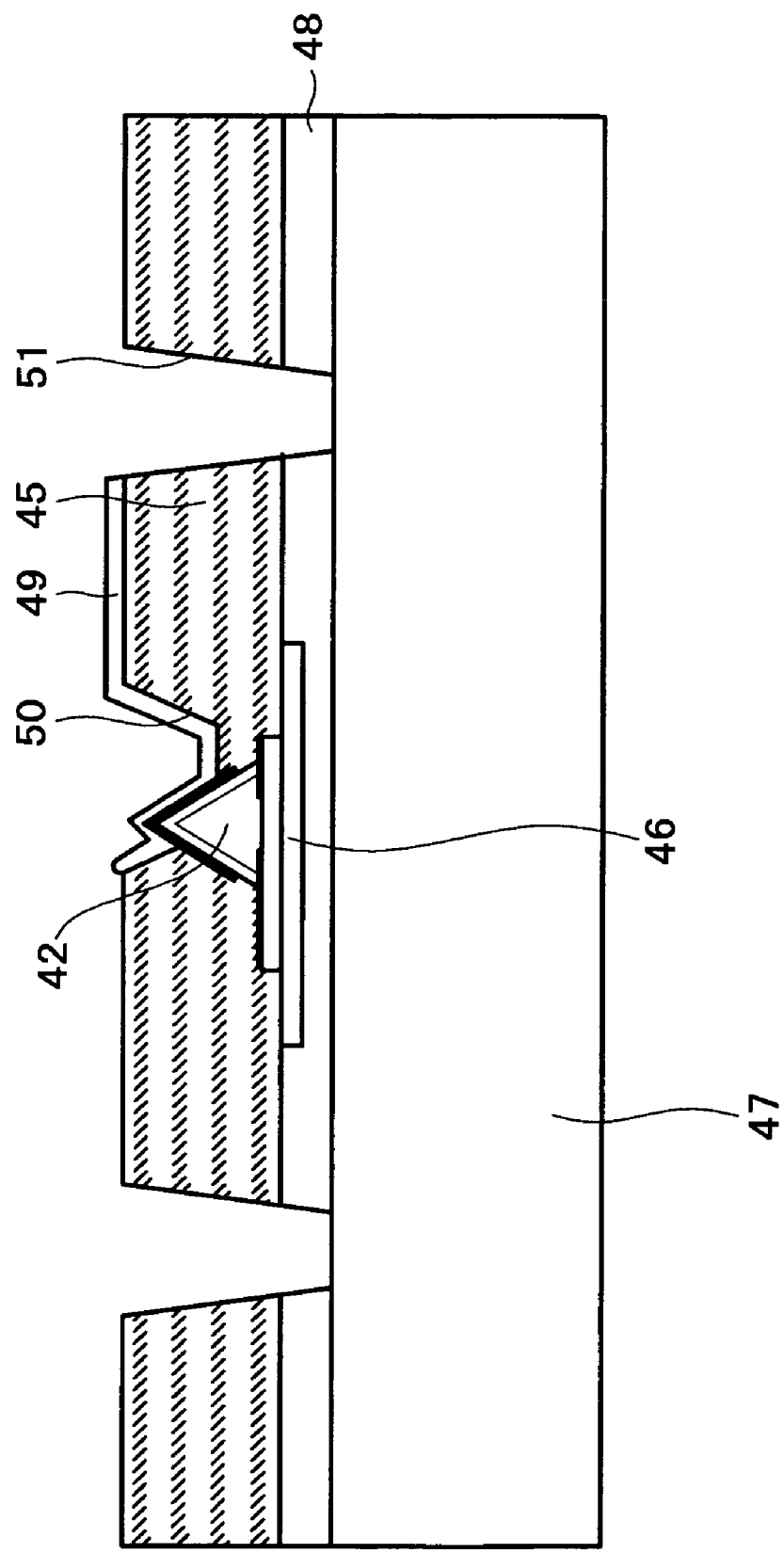
FIG. 9 is a sectional step diagram showing an electrode pad forming step after the transfer onto a second temporary holding member in the manufacturing method according to an embodiment of the present invention.

FIG. 9 shows the condition where the light-emitting diodes 42 have been transferred from the first temporary holding member 43 onto a second temporary holding member 47, via holes 50 on the anode (p-electrode) side have been formed, thereafter anode-side electrode pads 49 have been formed, and the adhesive layer 45 composed of the resin has been diced. As a result of the dicing, device separation grooves 51 are formed, so that the light-emitting diodes 42 are sectioned on a device basis. The device separation grooves 51, for separation of the light-emitting diodes 42 arranged in a matrix pattern, are composed of pluralities of parallel lines extending in row and column directions in a flat surface pattern. At bottom portions of the device separation grooves 51, the surface of the second temporary holding member 47 is exposed.

In addition, a release layer 48 is formed on the second temporary holding member 47. The release layer 48 can be formed, for example, by using a fluororesin coat, a silicone resin, a water-soluble adhesive (for example, PVA), a polyimide, or the like. As an example of the second temporary holding member 47, there can be adopted a so-called dicing sheet, which is composed of a plastic substrate coated with a UV-curable pressure sensitive adhesive and of which the tack is lowered upon irradiation with UV rays.

In conducting the transfer from the first temporary holding member 43 onto the second temporary holding member 47, the release layer 44 formed on the temporary holding member 43 is irradiated with excimer laser from the back side of the temporary holding member 43. Where the release layer 44 is formed of a polyimide, for example, the irradiation causes exfoliation at the interface between the polyimide and the quartz substrate through ablation of the polyimide, and each light-emitting diode 42 is transferred to the side of the secondary temporary holding member 47. In addition, in forming the anode-side electrode pads 49, the face side of the adhesive layer 45 is etched by oxygen plasma until the surfaces of the light-emitting diodes 42 are exposed. First, via holes 50 can be formed by use of excimer laser, high-harmonic YAG laser, or carbon dioxide laser. In this case, the via holes 50 each have a diameter of about 3 to 7 μm. The anode-side electrode pads 49 are formed of Ni/Pt/Au or the like. The dicing process is conducted by dicing using an ordinary blade, or is conducted by use of the above-mentioned laser where narrow cuts of not more than 20 μm in width are needed. The width of the cuts depends on the size of the light-emitting diodes 42 covered by the adhesive layer 45 formed of the resin in the pixel of the image display apparatus.

Figure 10:
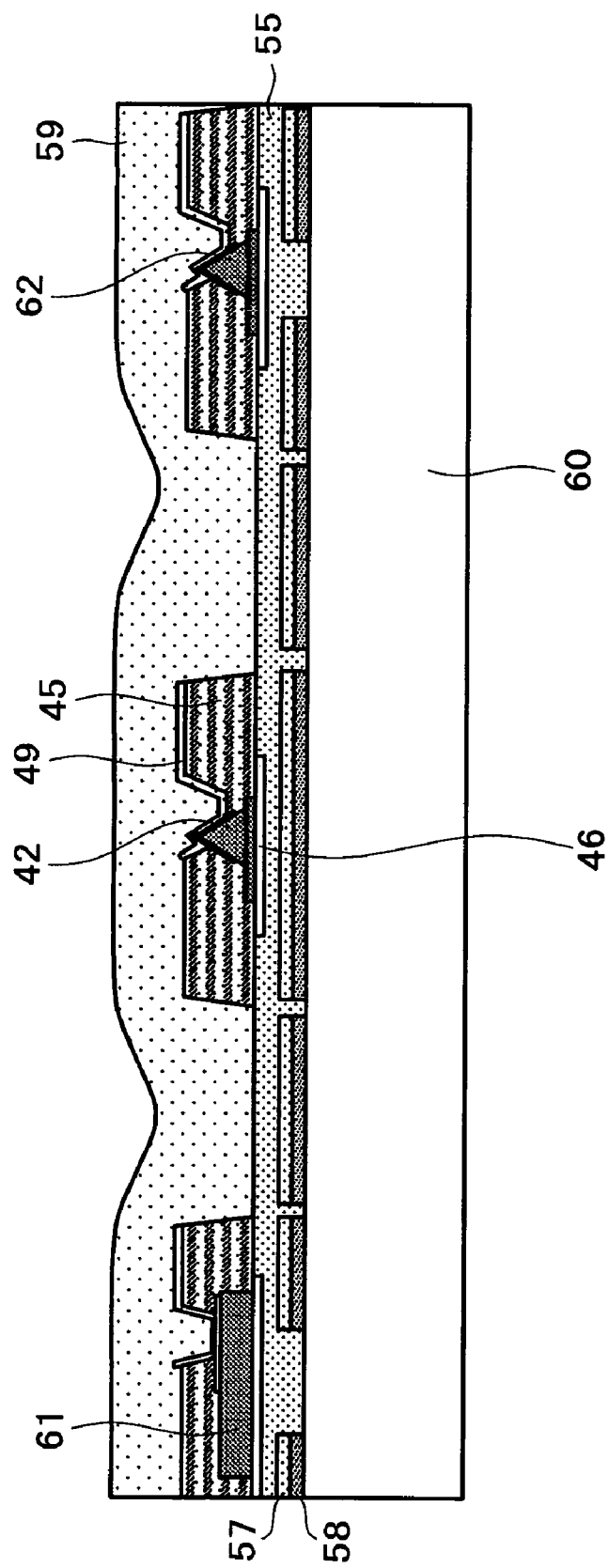
FIG. 10 is a sectional step diagram showing an insulation layer forming step in the manufacturing method according to an embodiment of the present invention.

FIG. 10 shows the condition where light-emitting diodes 42, 61, 62 for three colors of RGB have been arranged on a second substrate 60 and been coated with an insulation layer 59. When the light-emitting diodes 42, 61, 62 are mounted on the second substrate 60 at staggered color positions by the above-described transfer method, pixels composed of three colors can be formed, with the pixel pitch left unchanged. Examples of the material of the insulation layer 59 include transparent epoxy adhesives, UV-curable adhesives, polyimides, etc. The light-emitting diodes 42, 61, 62 for three colors may not necessary have the same shape. In FIG. 10, the red light-emitting diode 61 has a structure lacking the hexagonal pyramidal GaN layer, and is different in shape from other light-emitting diodes 42 and 62. In this stage, however, the light-emitting diodes 42, 61, 62 have already been covered by the resin-based adhesive to form resin-potted chips, so that the light-emitting diodes 42, 61, 62 can be handled in the same manner although they differ in device structure.

Figure 11:
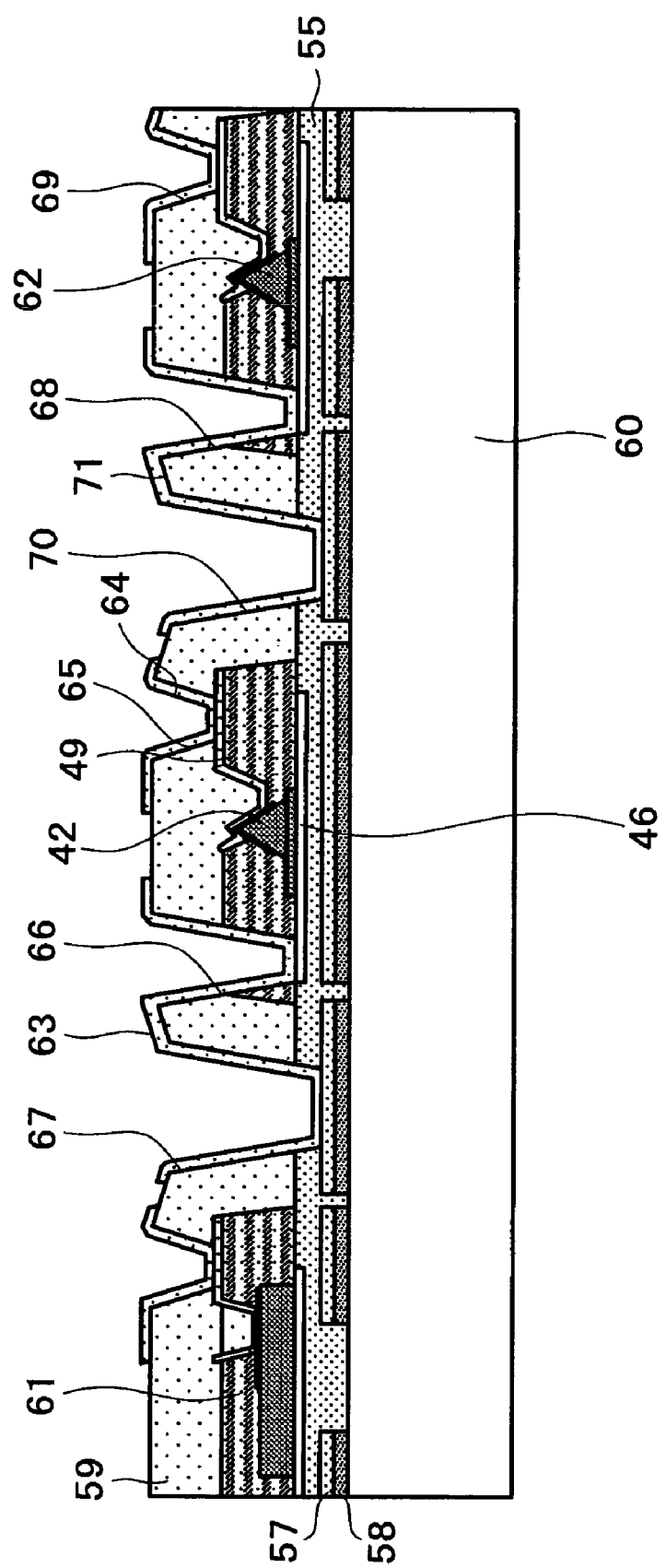
FIG. 11 is a sectional step diagram showing a wiring forming step in the manufacturing method according to an embodiment of the present invention.

FIG. 11 illustrates a step of forming wirings. In the figure, the insulation layer 59 have been provided with opening portions 65, 66, 67, 68, 69, 70, and wirings 63, 64, 71 for connection between the anode and cathode electrode pads of the light-emitting diodes 42, 61, 62 and an electrode layer 57 for wiring of the second substrate 60 have been formed. In this case, the opening portions, or via holes, can be large in shape because the areas of the electrode pads 46, 49 of the light-emitting diodes 42, 61, 62 are large, and the positional accuracy of the via holes can be rough, as compared with that of via holes formed directly in each light-emitting diode. The via holes may be about ϕ20 μm in diameter, for the electrode pads 46, 49 of about 60 μm square in size. In addition, the depths of the via holes are of three kinds, one for connection to the wiring substrate, one for connection to the anode, and one for connection to the cathode. Therefore, the opening portions are formed in optimal depths by controlling the number of pulses of laser. Thereafter, a protective layer is formed on the wirings, to complete a panel of the image display apparatus. In this case, the protective layer may be formed by use of a material such as a transparent epoxy adhesive, in the same manner as the insulation layer 59 shown in FIG. 11. The protective layer is hardened by heating, to completely cover the wirings. Thereafter, the wiring at a panel end portion is connected to a driver IC, to manufacture a drive panel, thereby completing the image display apparatus.

According to the method of manufacturing an image display apparatus in this example, the device interval has already been enlarged when the light-emitting diodes 42 are held on the first temporary holding member 43, so that electrode pads 46, 49 and the like comparatively large in size can be provided by utilizing the enlarged interval. Since wiring is conducted by utilizing the comparatively large electrode pads 46 and 49, the wirings can be easily formed even where the final apparatus size is extremely large as compared with the device size. In addition, in the method of manufacturing an image display apparatus according to this example, the surroundings of the light-emitting devices are flattened by coating with the adhesive layer 45, so that the electrode pads 46 and 49 can be formed with good accuracy. Furthermore, with the electrode pad 46 formed to be larger in size than the light output surface of the light-emitting diode 42, the light-emitting diode 42 can be securely connected to the electrode even where the light-emitting diode 42 is minute in size. Besides, with the electrode provided as a transparent electrode, it is possible to manufacture an image display apparatus with high image quality, without lowering the light output efficiency.

Second Embodiment

Next, as an embodiment of the present invention, an example in which electrodes are formed at parts of light output surfaces of light-emitting devices and a transparent electrode is formed so as to cover the whole areas of the light output surfaces will be described. This embodiment differs from the above-described first embodiment in that contact metals are formed on the light output surfaces of the light-emitting devices and that light emission side wiring layers are formed outside the regions of the light output surfaces. Now, a light-emitting apparatus, an image display apparatus, a method of manufacturing a light-emitting apparatus, and a method of manufacturing an image display apparatus according to the present invention will be described in detail below, referring to the drawings.

FIGS. 12A and 12B schematically illustrate the structure of a light-emitting device corresponding to one pixel in an image display apparatus formed by arranging the light-emitting devices according to this embodiment, in which FIG. 12A is a sectional view, and FIG. 12B is a plan view. The image display apparatus is configured by arranging a plurality of the light-emitting apparatuses, each of which corresponds to one pixel. As shown in FIG. 12A, the light-emitting apparatus and the image display apparatus according to this embodiment have a structure in which an adhesive layer 101 and a protective resin layer 102 are formed on a display substrate 100, a transparent electrode layer 103 is formed on the protective resin layer 102, and the transparent electrode layer 103 is connected to light output surfaces 105*a* of light-emitting devices 105R, 105G, 105B. FIG. 12A is a sectional view of the image display apparatus shown in FIG. 12B, taken along the broken line in FIG. 12B. Contact metals 104R, 104G, 104B are formed respectively on the light output surfaces 105*a* of the light-emitting devices 105R, 105G, 105B, and the transparent electrode 103 is connected also to the contact metals 104R, 104G, 104B. The light-emitting devices 105R, 105G, 105B are disposed in the state of being embedded in a device protective resin layer 106, a back-side resin layer 107 formed on the device protective resin layer 106 is provided with vias, and wiring layers 108R, 108G, 108B are formed respectively in the vias. The wiring layers 108R, 108G, 108B are respectively connected to bumps 109R, 109G, 109B at bottom portions of the vias.

The display substrate 100 is a transparent and flat plate-like member formed of a glass, a plastic, or the like, which transmits the lights emitted by the light-emitting devices 105R, 105G, 105B. The adhesive layer 101 is a layer for adhering the display substrate 100 to the protective resin layer 102, and can be formed by use of a material transmitting the lights emitted from the light-emitting devices 105R, 105G, 105B, for example, a thermosetting adhesive. The protective resin layer 102 is a layer for sealing the transparent electrode layer 103 to protect the transparent electrode layer 103, and can be formed by use of a light-transmitting and insulating material, for example, an epoxy resin. With the transparent electrode layer 103 sealed by the protective resin layer 102, the transparent electrode layer 103 can be prevented from being deformed or deteriorated.

The transparent electrode layer 103 is a layer formed of a light-transmitting and conductive material, and can be made by use of, for example, an ITO ink or the like. The transparent electrode layer 103 is formed to be larger in area than the light output surfaces 105*a* of the light-emitting devices 105R, 105G, 105B, so that the transparent electrode layer 103 is collectively electrically connected to the light-emitting devices 105R, 105G, 105B in one pixel. The thickness of the transparent electrode layer 103 must only be such a value as to cover the contact metals 104R, 104G, 104B and light emission side wiring layers 110, which will be described later. For example, the thickness may be about 2 to 3 μm. In the case where an ITO ink is used, the ITO ink contains about 20 to 30% of an acrylic resin. Therefore, there may be adopted a structure in which a resin sheet formed of a material containing little organic solvent components is sandwiched between the transparent electrode layer 103 and the protective resin layer 102. By sandwiching the resin sheet between the transparent electrode layer 103 and the protective resin layer 102, it is possible to prevent mutual diffusion between the transparent electrode layer 103 and the protective resin layer 102, and to prevent the conductivity of the transparent electrode layer 103 from being deteriorated. Accordingly, the resin sheet functions as a diffusion preventive layer for preventing mutual diffusion between a component of the transparent electrode layer 103 and a component of the protective resin layer 102.

In the light-emitting apparatus and the image display apparatus according to this embodiment, the transparent electrode layer 103 is formed to be larger in area than the light output surfaces 105a of the light-emitting devices 105R, 105G, 105B, thereby contriving connection between light emission side wiring layers 110 and the contact metals 104R, 104G, 104B. The lights emitted from the light-emitting devices 105R, 105G, 105B are emitted to the exterior of the image display apparatus without being shielded by the transparent electrode layer 103. Therefore, it is possible to enhance light output efficiency, as compared with the case where the transparent electrode layer 103 is formed with the same dimension of the light output surfaces 105a, and thereby to enhance the display characteristics of the light-emitting apparatus and of the image display apparatus.

The contact metals 104R, 104G, 104B are metallic layers formed on the light output surfaces 105a of the light-emitting devices 105R, 105G, 105B, and reduce the contact resistance concerning the contact with the light output surfaces 105a. In addition, the contact metals 104R, 104G, 104B make contact also with the transparent electrode layer 103, so that it is necessary to appropriately select the material of the contact metals according to the material of the transparent electrode layer 103. For example, a noble metal such as platinum (Pt) and gold (Au) is used for the contact metals. Where an ITO ink is used for forming the transparent electrode layer 103, corrosion through an oxidation reaction due to oxygen contained in the ITO ink can be prevented by forming the contact metals 104R, 104G, 104B by use of a noble metal. In this case, the contact metals 104R, 104G, 104B may have a multi-layer structure in which, for example, a metallic layer of nickel (Ni), aluminum (Al), or copper (Cu) is formed on the side of the light output surfaces 105a of the light-emitting devices 105R, 105G, 105B, and then a layer of a noble metal such as platinum and gold is formed at the outermost surfaces. With the outermost surfaces of the contact metals 104R, 104G, 104B formed of a noble metal, oxidation in the regions of contact with the transparent electrode layer 103 can be prevented.

In addition, the regions where the contact metals 104R, 104G, 104B are formed are in the vicinity of peripheral portions of the light output surfaces 105a, and are preferably those regions that do not overlap with the regions where the bumps 109R, 109G, 109B are formed. This arrangement is for reducing the amounts of lights shielded by the contact metals 104R, 104G, 104B at the time of light emission from the light-emitting devices 105R, 105G, 105B, whereby light output efficiency can be enhanced.

The light-emitting devices 105R, 105G, 105B are devices for emitting light in red, green, and blue colors, respectively, and are home-type light-emitting diodes or hetero-type light-emitting diodes formed by laminating an n-type semiconductor layer and a p-type semiconductor layer, for example. While the light-emitting devices 105R, 105G, 105B are in the shape of chips in the figure, the structure in this example is not limitative, and the light-emitting devices 105R, 105G, 105B may be light-emitting diodes formed by selecting required device structure and materials for making it possible to emit lights at various wavelengths such as blue, green, yellow, red, infrared, etc. Besides, the light-emitting devices 105R, 105G, 105B may be light-emitting diodes enhanced in light emission efficiency by forming a double hetero structure or a quantum well structure in which an active layer 105b is sandwiched between a p-type clad layer and an n-type clad layer.

While the light-emitting diode 1 is a roughly cylindrical light-emitting diode in this example, the light-emitting diode 1 may be a light-emitting diode in which the lamination direction of the semiconductor layers is inclined against the major surface of the device forming substrate. The shape of the light-emitting diode is not limited to the roughly flat plate-like shape as in this example, and may be any shape. For example, a light-emitting diode in which the sectional device shape is tapered, the outside shape is a hexagonal pyramid, or the like may be adopted. Furthermore, the light-emitting device according to the present invention is not limited to a light-emitting diode, and may be a light-emitting device such as a semiconductor laser device. Where light-emitting diodes are used as the light-emitting devices 105R, 105G, 105B, the driving method for light emission can be driven by an electric current; therefore, good light emission characteristics can be obtained even where the sheet resistance is comparatively high due to the use of the transparent electrode layer 103.

A device holding resin layer 106 is an insulating resin layer for embedding and fixedly holding the light-emitting devices 105R, 105G, 105B therein. The layer 106 is formed by use of a material capable of being hardened (cured) upon irradiation with light, for example, a photosensitive epoxy resin. The device holding resin layer 106 is formed in an uncured state before the embedding of the light-emitting devices 105R, 105G, 105R therein, and is cured (hardened) by exposure after the embedding. A back-side resin layer 107 is an insulating resin layer formed on the device holding resin layer 106, and is provided with vias at positions where bumps 109R, 109G, 109B of the light-emitting devices 105R, 105G, 105B are formed. Wiring layers 108R, 108G, 108B are metallic layers so formed as to cover the inside walls of the vias opened in the back-side resin layer 107 and the bumps 109R, 109G, 109B, and are electrically connected to the bumps 109R, 109G, 109B in the vias. The bumps 109R, 109G, 109B are metallic layers formed on the light-emitting devices 105R, 105G, 105B, are electrically connected to the semiconductor layers of the light-emitting devices 105R, 105G, 105B and connected to the wiring layers 108R, 108G, 108B.

As shown in the plan view in FIG. 12B, the wiring layers 108R, 108G, 108B are formed in a belt-like shape extending in y-axis direction in the figure so as to cover the positions where the light-emitting devices 105R, 105G, 105B are formed, respectively. In addition, in the plane where the contact metals 104R, 104G, 104B are formed, the light emission side wiring layers 110, which will be described later, are formed in a belt-like shape extending in x-axis direction in the figure, and is electrically connected to the transparent electrode layer 103. The light emission side wiring layers 110 also make contact with the transparent electrode layer 103, like the contact metals 104R, 104G, 104B. Therefore, the material of the light emission side wiring layers 110 must be appropriately selected according to the material of the transparent electrode layer 103, and is, for example, a noble metal such as platinum and gold. Where the transparent electrode layer 103 is formed by use of an ITO ink, corrosion through an oxidation reaction due to oxygen contained in the ITO ink can be prevented by forming the light emission side wiring layers 110 by use of a noble metal. In this case, the light emission side wiring layers 110 may have a multi-layer structure in which, for example, a nickel layer is formed, and then a layer of a noble metal such as platinum and gold is formed at the outermost surface. With the outermost surfaces of the light emission side wiring layers 110 formed of a noble metal, it is possible to prevent oxidation in the regions of contact with the transparent electrode layer 103.

As shown in FIG. 12B, the regions where the light emission side wiring layers 110, which will be described later, are formed are outside the regions of the light output surfaces 105a of the light-emitting devices 105R, 105G, 105B, and do not overlap with the locations where the light-emitting devices 105R, 105G, 105B are formed, so that the light emission side wiring layers 110 do not make direct contact with the contact metals 104R, 104G, 104B. However, both the light emission side wiring layers 110 and the contact metals 104R, 104G, 104B are in contact with the transparent electrode layer 103. Therefore, they are electrically connected to each other through the transparent electrode layer 103. Since the light emission side wiring layers 110 are so formed as not to overlap with the light-emitting devices 105R, 105G, 105B, the lights emitted from the light output surfaces 105a at the time of light emission from the light-emitting devices 105R, 105G, 105B are not shielded by the light emission side wiring layers 110, so that it is possible to enhance light output efficiency and to perform light emission and image display with good display characteristics.

In addition, outside the pixel region of the back-side resin layer 107 and the device holding resin layer 106, there is opened a lead via extending from the plane of formation of the wiring layers 108R, 108G, 108B and reaching the light emission side wiring layer 110. A metallic layer is formed in the lead via, to form a lead pad 111. The lead pad 111 is formed by use of a metal, which is ordinarily used as an electric wiring, for example, copper. Since the lead pad 111 is connected to the light emission side wiring layer 110 through the via and the light emission side wiring layer 110 is electrically connected to the wiring layers 108R, 108G, 108B through the transparent electrode layer 103, the light output surfaces 105a of the light-emitting devices 105R, 105G, 105B are electrically connected to the lead pad 111. As a result, when a voltage is impressed between any one of the wiring layers 108R, 108G, 108B and the lead pad 111, an electric current is passed to the corresponding light-emitting device 105R, 105G, or 105B, which emits light at a predetermined wavelength.

While the structure of the light-emitting apparatus, which is one pixel constituted of the light-emitting devices 105R, 105G, 105B for light emission in red, green, and blue is shown in FIGS. 12A and 12B, in an actual image display apparatus the pixels having the structure shown in FIGS. 12A and 12B are arranged in a row direction and a column direction on the display substrate 100. Besides, the wiring layers 108R, 108G, 108B and the light emission side wiring layer 110 extend respectively in the column direction and the row direction on the display substrate 100, and the wiring layers may each be formed as a common wiring for the pixels disposed in the same row direction and for the pixels disposed in the same column direction. Where the wiring layers 108R, 108G, 108B and the light emission side wiring layers 110 are formed as common wirings in the image display apparatus, it is possible to obtain a passive matrix drive type or active matrix drive type image display apparatus in which the plurality of wiring layers 108R, 108G, 108B formed in the column direction are column wirings and the plurality of light emission side wiring layers 110 formed in the row direction are row wirings.

Next, the method of manufacturing the light-emitting apparatus and the image display apparatus according to this embodiment will be described in detail, referring to FIGS. 13A and 13B to 29A and 29B. Incidentally, while the light-emitting apparatus, which is the structure per pixel in the image display apparatus, will be shown in the following description, the image display apparatus includes a plurality of pixels arranged in the row direction and the column direction, and the individual pixels have the same structure.

First, as shown in the sectional view in FIG. 13A and the plan view in FIG. 13B, an embedding substrate 200, which is a flat plate-like member, is prepared, and alignment marks 201R, 201G, 201B are formed at predetermined positions on the embedding substrate 200. FIG. 13A is a sectional view taken along the broken line direction in FIG. 13B. As the embedding substrate 200, for example, a disk form sapphire substrate with a diameter of about 2 in can be used. It suffices that the material of the embedding substrate 200 has a flat surface and a predetermined rigidity, and the shape thereof may be any of various shapes such as a rectangular shape. The alignment marks 201R, 201G, 201B can be formed, for example, by vapor-depositing titanium on the embedding substrate 200 and conducting lift-off to leave titanium in predetermined regions. The alignment marks 201R, 201G, 201B are formed one in each predetermined region in the region of one pixel, and are used as marks for alignment in disposing the light-emitting devices in a later step. Since the alignment marks 201R, 201G, 201B are marks for alignment, it suffices for them to have such a thickness as to enable discrimination thereof from the other regions. For example, the alignment marks may be in a thin film form with a thickness of about 10 nm. The region corresponding to one pixel shown in FIG. 13B is, for example, a square with each side being about 150 µm in length.

Next, as shown in the sectional view in FIG. 14A and the plan view in FIG. 14B, an embedding resin layer 202 is formed on the side, where the alignment marks 201R, 201G, 201B are formed, of the embedding substrate 200. FIG. 14A is a sectional view taken along the broken line direction in FIG. 14B. The embedding resin layer 202 is formed by use of a resin, which has such a degree of plasticity that the light-emitting devices, can be embedded therein and which can be cured by light exposure, heating, or the like. For example, the embedding resin layer 202 may be formed by applying a photosensitive epoxy resin by a laminating operation. The thickness of the embedding resin layer 202 must be not less than the height of the light-emitting devices to be embedded. For example, the embedding resin layer 202 is formed in a thickness of about 15 µm to about 30 µm. At this stage, since the light-emitting devices are not yet embedded in the embedding resin layer 202, the embedding resin layer 202 is in a plastic state.

Next, as shown in the sectional view in FIG. 15A and the plan view in FIG. 15B, a mask 203 is arranged near the surface of the embedding resin layer 202, light exposure is applied to the regions not covered with the mask 203, to cure predetermined regions of the embedding resin layer 202, thereby forming separation walls 204 extending from the surface of the embedding resin layer 202 to the embedding substrate 200. FIG. 15A is a sectional view taken along the broken line direction in FIG. 15B. As shown in the figures, the separation walls 204 are formed in the shape of frames such as to surround the alignment marks 201R, 201G, 201B in the pixel, whereby the region of the pixel is divided on the basis of each light-emitting device embedding region. With the separation walls 204 thus formed, it is possible to obviate the problem that the embedding resin layer 202 would flow to cause a positional stagger in the already embedded light-emitting device, at the time of embedding the light-emitting devices into the embedding resin layer 202 in a later step. At this stage, the preparation for embedding the light-emitting devices into the embedding resin layer 202 is completed.

Separately from the preparation of the embedding substrate 200 and the embedding resin layer 202 as above-described, as shown in the sectional view in FIG. 16A and the plan view in FIG. 16B, a transfer substrate 205 with a plurality of light-emitting devices 105R arranged thereon is prepared, and the light-emitting devices 105R are selectively transferred onto a relay substrate 206 coated with a silicone layer 207. FIG. 16A is a sectional view taken along the broken line direction in FIG. 16B. As the transfer substrate 205, for example, a sapphire substrate is used. The light-emitting devices 105R arranged on the transfer substrate 205 may be those which have been crystal-grown on another substrate and been transferred onto the transfer substrate 205, and the light-emitting devices 105R are adhered to the transfer substrate 205 by use of an adhesive or the like. The selective transfer of the light-emitting devices 105R from the transfer substrate 205 onto the relay substrate 206 can be carried out by a method in which predetermined ones of the light-emitting devices 105R are irradiated with laser beams from the side of the transfer substrate 205 by use of an excimer laser or the like so as to weaken the adhesive force between the light-emitting devices 105R and the transfer substrate 205.

The light-emitting devices 105R thus transferred are the devices located at positions spaced from each other by predetermined intervals in the row direction and the column direction on the transfer substrate 205, as shown in FIG. 16B, and the light-emitting devices 105R are transferred one for each region, corresponding to one pixel, of the embedding substrate 200. For example, where the region corresponding to one pixel on the embedding substrate 200 is a square with each side being about 150 μ, the light-emitting devices 105R transferred are also transferred at an interval of about 150 μm. The light-emitting devices 105R irradiated with the laser beams are exfoliated from the transfer substrate 205 and transferred onto the relay substrate 206, due to a lowering in the adhesive force of the adhesive. In this case, the light output surfaces 105a of the light-emitting devices 105R are brought into contact with the silicone layer 207, so that the light-emitting devices 105R are held on the relay substrate 206 by the tack of the silicone layer 207. While the description has been made here only of the light-emitting devices 105R for emitting light in red color, as shown in the figures, the light-emitting devices 105G for emitting light in green color and the light-emitting devices 105B for emitting light in blue color are also separately transferred selectively from the transfer substrate 205 onto the relay substrate 206 in the same manner as above.

Next, as shown in the sectional view in FIG. 17A and the plan view in FIG. 17B, the light-emitting devices 105R held on the relay substrate 206 are embedded into the embedding resin layer 202. FIG. 17A is a sectional view taken along the broken line direction in FIG. 17B. In this case, since the embedding substrate 200 is provided with the alignment marks 201R, the positional relationship between the relay substrate 206 and the embedding substrate 200 is so regulated that the light-emitting devices 105R are located at the positions of the alignment marks 201R. When the positions of the alignment marks 201R and the light-emitting devices 105R have come to overlap with each other, the embedding substrate 200 and the relay substrate 206 are brought closer to each other, and the light-emitting devices 105R are embedded into the embedding resin layer 202. Since the embedding resin layer 202 is surrounded by the partially cured separation walls 204, in the process of embedding the light-emitting devices 105R into the embedding resin layer 202 as above-mentioned, the embedding resin layer 202 in the outside of the separation walls 204 can be prevented from flowing. Besides, the step of embedding the light-emitting devices 105R into the embedding resin layer 202 may be so carried out that the light-emitting devices 105R are embedded by a single embedding operation. Alternatively, the light-emitting devices 105R may be exfoliated from the relay substrate 206 in the condition of being embedded partly, and then they may be embedded further by a laminating operation or the like to such an extent that the light output surfaces 105a of the light-emitting devices 105R become substantially flush with the surface of the embedding resin layer 202.

Figures 18A, 18B:
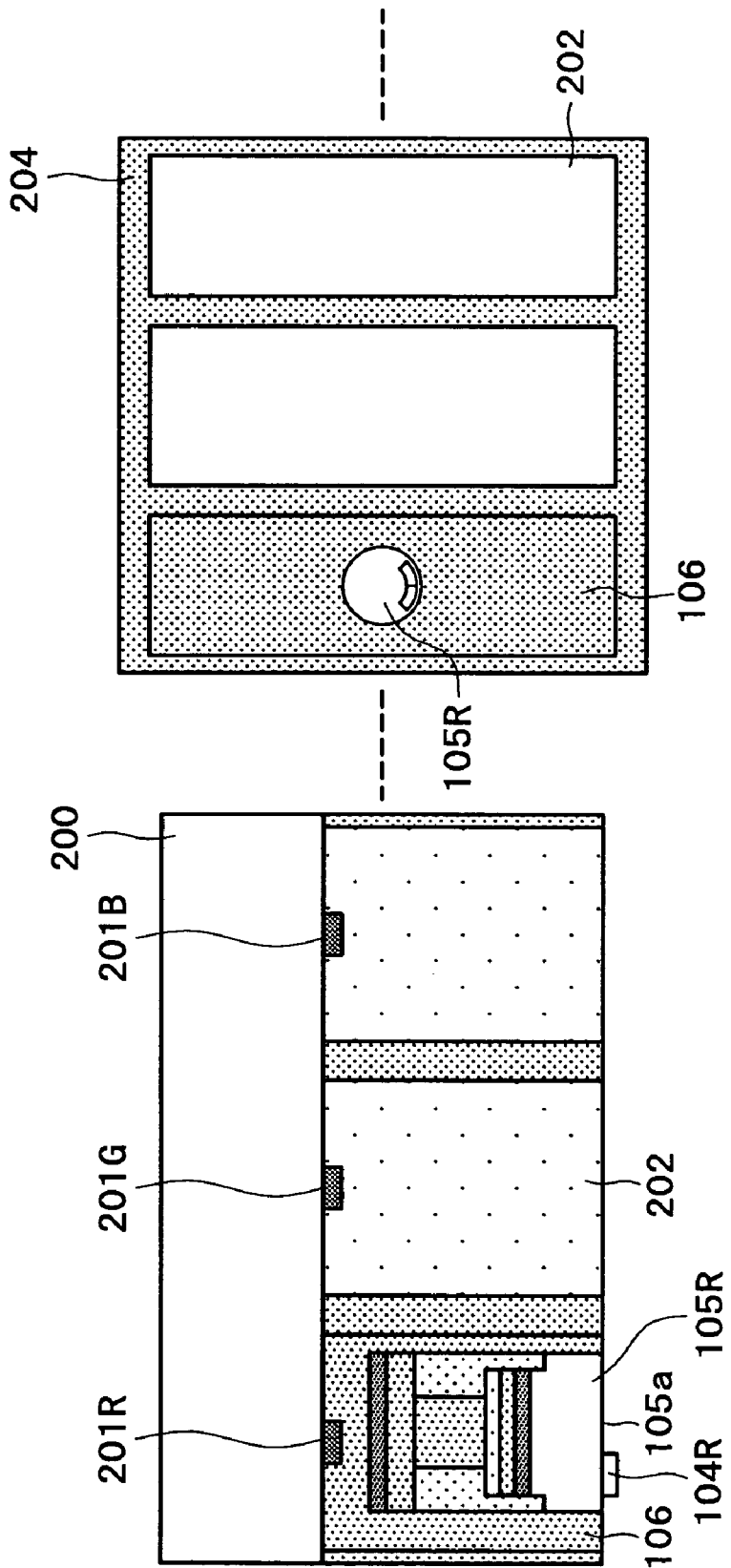

Next, as shown in the sectional view in FIG. 18A and the plan view in FIG. 18B, after the light-emitting devices 105R are embedded to such an extent that the light output surfaces 105a of the light-emitting devices 105R are substantially flush with the surface of the embedding resin layer 202, the embedding resin layer 202 in the regions where the light-emitting devices 105R have been embedded is cured by light exposure, to form a device holding resin layer 106. FIG. 18A is a sectional view taken along the broken line direction in FIG. 18B. By curing the embedding resin layer 202 to form the device holding resin layer 106, the positions of the light-emitting devices 105R in pixels are fixed. As shown in the sectional view in FIG. 19A and the plan view in FIG. 19B, the light-emitting devices 105G and 105B are embedded into the embedding resin layer 202 at the positions of the alignment marks 201G and 201B, and cured by light exposure to form device holding resin layers 106, in the same procedure as shown in FIGS. 16A and 16B to 18A and 18B. FIG. 19A is a sectional view taken along the broken line direction in FIG. 19B. When the light-emitting devices 105R, 105G, 105B are transferred onto the relay substrate 206 by the selective transfer such as to provide device intervals equal to the pixel size as shown in FIG. 16B, the devices can be collectively aligned and embedded for a plurality of pixels.

Next, as shown in the lateral sectional view in FIG. 20A and the plan view in FIG. 20B, electrode separation walls 208 are formed on the device holding resin layers 106. FIG. 20A is a sectional view of the image display apparatus as viewed along arrow A in FIG. 19A, namely, as viewed in a direction at 90 degrees against the sectional views shown in FIGS. 12A and 12B to 19A and 19B, and is a sectional view taken along the broken line direction in FIG. 20B and viewed from the same direction as arrow A in FIG. 20B. The electrode separation walls 208 can be formed by a method in which a resist film is applied onto the device holding resin layers 106, then predetermined regions thereof are hardened and the unhardened regions thereof are removed, by photolithographic technique. The hardened resist film becomes the electrode separation walls 208, and the removed regions constitute opening portions such as to expose the light output surfaces 105*a* and the contact metals 104R, 104G, 104B of the light-emitting devices 105R, 105G, 105B.

The electrode separation walls 208 are patterns formed outside the region of the transparent electrode layer in each pixel. With the electrode separation walls 208 thus formed, a step is generated between the surface of the device holding resin layers 106 and the surface of the electrode separation walls 208. The regions where the device holding resin layers 106 are exposed at this stage are regions where the transparent electrode layer 103 is to be formed in a later step. As shown in FIG. 20B, the regions where the electrode separation walls 208 are formed are outside the regions where the light-emitting devices 105R, 105G, 105B are embedded, and the regions where the electrode separation walls 208 are not formed are in a belt-like shape, and each include the light-emitting devices 105R, 105G, 105B collectively. Besides, the regions where the electrode separation walls 208 are not formed are somewhat larger than the regions where the light-emitting devices 105R, 105G, 105B are formed, to such an extent that light emission side wiring layers can be formed in a later step. Therefore, even upon formation of the electrode separation walls 208, the light output surfaces 105*a* of the light-emitting devices 105R, 105G, 105B are exposed from the device holding resin layers 106, and the contact metals 104R, 104G, 104B are also exposed.

Next, as shown in the lateral sectional view in FIG. 21A and the plan view in FIG. 21B, the light emission side wiring layers 110 are formed in the regions where the device holding resin layers 106 are exposed and the electrode separation walls 208 are not formed. FIG. 21A is a sectional view taken along the broken line direction in FIG. 21B. The light emission side wiring layers 110 are formed in a belt-like shape with a width of 50 μm, for example, so as to cross each pixel in the left-right direction in FIG. 21B, is not formed at the positions where the light-emitting devices 105R, 105G, 105B are embedded, and is so formed as not to make contact with the contact metals 104R, 104G, 104B. Since the light emission side wiring layers 110 are so formed as not to overlap with the light-emitting devices 105R, 105G, 105B, the lights emitted from the light-emitting devices 105R, 105G, 105B and radiated from the light output surfaces 105*a* are not shielded by the light emission side wiring layers 110, so that it is possible to enhance light output efficiency and to perform an image display with good display characteristics. In addition, since it is unnecessary to set the light emission side wiring layers 110 in contact with the contact metals 104R, 104G, 104B, it is possible to lower the positioning accuracy in forming the light emission side wiring layers 110 and to enhance the operating efficiency, as compared with the case of setting the light emission side wiring layers 110 in contact with the minute contact metals 104R, 104G, 104B. While an example of forming the light emission side wiring layers 110 after formation of the electrode separation walls 208 has been described here, the electrode separation walls 208 may be formed after formation of the light emission side wiring layers 110.

The light emission side wiring layer 110 is formed, for example, by a method in which a titanium (Ti) layer in a thickness of about 50 nm is formed on the device holding resin layers 106 by sputtering, then Ti is laminated thereon in a thickness of about 10 nm by vapor deposition, and gold (Au) is laminated in a thickness of about 0.5 μm by vapor deposition. In this case, Au is exposed at the outermost surfaces of the light emission side wiring layers 110, and the material coming into contact with the transparent electrode layer 103 in a later step is gold, which is a noble metal. With the outermost surfaces of the light emission side wiring layers 110 formed of the noble metal, it is possible to prevent the light emission side wiring layers 110 from being corroded due to oxidation or the like.

Next, as shown in the lateral sectional view in FIG. 22A and the plan view in FIG. 22B, an ITO ink is applied onto the device holding resin layers 106 and onto the electrode separation walls 208 by spin coating, and is hardened by baking, to form the transparent electrode layer 103. FIG. 22A is a sectional view taken along the broken line direction in FIG. 22B. For application of the ITO ink, not only spin coating but also a screen printing technique, jetting of the ITO ink by an ink jet technique, and the like may be used. At this stage, the transparent electrode layer 103 is formed on the whole surfaces of pixels so as to cover the device holding resin layers 106, the electrode separation walls 208, the light output surfaces 105*a* of the light-emitting devices 105R, 105G, 105B, the contact metals 104R, 104G, 104B, and the light emission side wiring layers 110.

Since the transparent electrode layer 103 is formed in contact with the contact metals 104R, 104G, 104B and the light emission side wiring layers 110, the contact metals 104R, 104G, 104B and the light emission side wiring layers 110 are electrically connected to each other through the transparent electrode layer 103. It is necessary to form the transparent electrode layer 103 in such a thickness as to cover the contact metals 104R, 104G, 104B and the light emission side wiring layers 110. The thickness may be about 5 μm in the case where the light emission side wring layer 110 is formed by laminating Ti/Ti/Au in a thickness combination of 50 nm/10 nm/0.5 μm. With the light emission side wiring layers 110 electrically connected to the contact metals 104R, 104G, 104B through the transparent electrode layer 103, the electrical connection between the light emission side wiring layers 110 and the contact metals 104R, 104G, 104B can be secured through the transparent electrode layer 103, which is formed over a wide range. Therefore, since the transparent electrode layer 103 is so formed as to securely cover the contact metals 104R, 104G, 104B, it is possible to lower the accuracy of the positions of embedding the light-emitting devices 105R, 105G, 105B and the positions of forming the contact metals 104R, 104G, 104B in each pixel, and to contrive a higher operating efficiency. In the present invention, the thickness of the transparent electrode layer 103 can be enlarged up to about the thickness of the electrode separation walls 208. Therefore, it is possible to easily secure electrical connection between the transparent electrode layer 103 and the contact metals 104R, 104G, 104B while easily coping with not only the positional accuracy in the horizontal directions in each pixel but also the positional staggers in the height direction, which may be generated upon embedding the light-emitting devices 105R, 105G, 105B.

Next, as shown in the lateral sectional view in FIG. 23A and the plan view in FIG. 23B, the transparent electrode layer 103 is polished by Chemical Mechanical Polishing (CMP) by use of the Damascene process, to such an extent that the surfaces of the electrode separation walls 208 are exposed. FIG. 23A is a sectional view taken along the broken line direction in FIG. 23B. Where the transparent electrode layer 103 is softer than the electrode separation walls 208, the transparent electrode layer 103 upon polishing is thinner than the electrode separation walls 208 as shown in the figure. Therefore, it is necessary to set the thickness of the electrode separation walls 208 at such an extent that the thickness of the transparent electrode layer 103 upon polishing is sufficiently secured. In addition, the transparent electrode layer 103 upon polishing must have such a thickness as to enable connection between the contact metals 104R, 104G, 104B and the light emission side wiring layers 110. In view of this, for example, the transparent electrode layer 103 is formed in a thickness of about 5 μm before polishing, and a thickness of about 3 μm is maintained after polishing. Where a minute amount of an ITO ink is applied by use of the ink jet technique at the time of forming the transparent electrode layer 103 as above-mentioned, it is possible to regulate the amount of the ITO ink applied, thereby ensuring that the transparent electrode layer 103 will not be laminated on the electrode separation walls 208. Accordingly, it is possible to omit the step of polishing the transparent electrode layer 103.

Next, as shown in the lateral sectional view in FIG. 24A and the plan view in FIG. 24B, an epoxy resin is laminated on the transparent electrode layer 103 and the electrode separation walls 208 by a laminating operation, to form a protective resin layer 102. FIG. 24A is a sectional view taken along the broken line direction in FIG. 24B. In some cases, the surface of the transparent electrode layer 103 upon polishing may be rugged. By forming the protective resin layer 102 on the transparent electrode layer 103 and the electrode separation walls 208, however, it is possible to render the surface of the protective resin layer 102 flat, and to cover, seal, and protect the transparent electrode layer 103.

Next, as shown in the lateral sectional view in FIG. 25A and the plan view in FIG. 25B, a display substrate 100 is adhered to the protective resin layer 102 with an adhesive layer 101 in vacuum, by use of a vacuum adhesion apparatus. FIG. 25A is a sectional view taken along the broken line direction in FIG. 25B. With the adhesion conducted in vacuum, it is possible to prevent bubbles from entering between the display substrate 100 and the protective resin layer 102. In this case, a variety of adhesive layers 101 can be used. For example, a thermosetting adhesive may be used, and the adhesive layer 101 may be cured by heating. With the protective resin layer 102 formed on the transparent electrode layer 103 and the electrode separation walls 208, it is possible to render the surface of the protective resin layer 102 flat, irrespective of the presence or absence of ruggedness in the surface of the transparent electrode layer 103, and it is therefore easy to adhere the flat and hard display substrate 100 to the protective resin layer 102.

Next, as shown in the sectional view in FIG. 26A and the top plan view in FIG. 26B, the assembly is irradiated with excimer laser beams from the side of the embedding substrate 200, to cause exfoliation at the interface between the embedding substrate 200 and the device holding resin layers 106 through laser ablation. FIG. 26A is a sectional view taken along the broken line direction in FIG. 26B. FIG. 26B is a plan view of one pixel in the image display apparatus as viewed from the side of the device holding resin layers 106. Upon irradiation with the laser beams, a reaction of thermal melting of the device holding resin layers 106 or the like occurs at the interface between the embedding substrate 200 and the device holding resin layers 106, it is possible to easily release the device holding resin layers 106 from the embedding substrate 200, thereby exposing the alignment marks 201R, 201G, 201B.

Next, as shown in the sectional view in FIG. 27A and the top plan view in FIG. 27B, the device holding resin layers 106 are etched from the side of the alignment marks 201R, 201G, 201B, to expose the bumps 109R, 109G, 109B of the light-emitting devices 105R, 105G, 105B. FIG. 27A is a sectional view taken along the broken line direction in FIG. 27B. In this case, the removal of the device holding resin layers 106 is conducted to such an extent that the bumps 109R, 109G, 109B protrude from the device holding resin layers 106. In order to cause the bumps 109R, 109G, 109B to protrude, the resin removed by the etching includes not only the resin of the device holding resin layers 106 but also the resin with which the main bodies of the light-emitting devices 105R, 105G, 105B are packaged.

Next, as shown in the sectional view in FIG. 28A and the top plan view of FIG. 28B, a back-side resin layer 107 is laminated on the device holding resin layers 106 with the bumps 109R, 109G, 109B exposed, and then vias 112R, 112G, 112B for exposing the bumps 109R, 109G, 109B are opened by a photolithographic technique. FIG. 28A is a sectional view taken along the broken line direction in FIG. 28B. With the back-side resin layer 107 thus formed, the bumps 109R, 109G, 109B are located below the surface of the back-side resin layer 107, and are exposed from the bias 112R, 112G, 112B, which are formed isolatedly. The bumps 109R, 109G, 109B are isolated by the presence of the back-side resin layer 107 and the vias 112R, 112G, 112B, whereby it is possible to restrain the generation of shortcircuit troubles due to contact between adjacent wirings, at the time of forming wiring layers 108R, 108G, 108B in a later step.

Next, as shown in the sectional view in FIG. 29A and the top plan view in FIG. 29B, in the outside of the region of the pixels in the image display apparatus, a lead via 113 extending from the back-side resin layer 107 to the light emission side wiring layer 110 is opened by etching or the like. FIG. 29A is a sectional view taken along the broken line direction in FIG. 29B. Since the light emission side wiring layer 110 is formed with a large width of about 50 μm, for example, as exemplified in FIGS. 21A and 21B, it suffices that the positional accuracy in opening the lead via 113 is on the order of a few micrometers.

Finally, as shown in the sectional view in FIG. 30A and the top plan view in FIG. 30B, wiring layers 108R, 108G, 108B are formed so as to cover the vias 112R, 112G, 112B, and a lead pad 111 is formed so as to fill up the lead via 113. FIG. 30A is a sectional view taken along the broken line direction in FIG. 30B. The wiring layers 108R, 108G, 108B and the lead pad 111 can be formed, for example, by a method in which titanium (Ti) and copper (Cu) as seed metals are deposited by sputtering, then copper is built up by plating, and patterning is conducted by wet etching.

By use of the method of manufacturing a light-emitting apparatus and the method of manufacturing an image display apparatus described above referring to FIGS. 13A and 13B to 30A and 30B, it is possible to obtain an image display apparatus in which a plurality of pixels having the structure shown in FIGS. 30A and 30B are arranged in the row direction and the column direction. Where the wiring layers 108R, 108G, 108B and the light emission side wiring layers 110 are formed as common wirings in the image display apparatus, it is possible to obtain a passive matrix drive type or active matrix drive type image display apparatus in which the plurality of wiring layers 108R, 108G, 108B formed in the column direction constitute column wirings and the plurality of light emission side wiring layers 110 arranged in the row direction constitute row wirings.

When the method of manufacturing a light-emitting apparatus and the method of manufacturing an image display apparatus described in this embodiment are used, it is unnecessary to set the light emission side wiring layers 110 in contact with the contact metals 104R, 104G, 104B, so that it is possible to lower the positional accuracy in forming the light emission side wiring layers 110 and therefore to enhance operating efficiency, as compared with the case where the light emission side wiring layer 110 are set in contact with the minute contact metals 104R, 104G, 104B.

In the light-emitting apparatus and the image display apparatus according to this embodiment, the transparent electrode layer 103 is formed to be larger in area than the light output surfaces 105a of the light-emitting devices 105R, 105G, 105B, to achieve connection between the light emission side wiring layers 110 and the contact metals 104R, 104G, 104B. Since the lights emitted from the light-emitting devices 105R, 105G, 105B are radiated to the exterior of the image display apparatus without being shielded by the transparent electrode layer 103, it is possible to enhance light output efficiency and to enhance display characteristics of the image display apparatus, as compared with the case where the transparent electrode layer 103 is formed with the same dimension of the light output surfaces 105a.

By forming the outermost surfaces of the contact metals 104R, 104G, 104B of a noble metal, it is possible to prevent oxidation of the contact metals 104R, 104G, 104B in the regions of contact with the transparent electrode layer 103. Besides, by forming the outermost surfaces of the light emission side wiring layers 110 of a noble metal, it is possible to prevent oxidation of the light emission side wiring layers 110 in the regions of contact with the transparent electrode layer 103. This makes it possible to prevent the contact metals and the light emission side wiring layers from being deteriorated due to corrosion with the result of an increase in the electric resistance thereof.

It is desirable that the regions where the contact metals 104R, 104G, 104B are formed are in the vicinity of peripheral portions of the light output surfaces 105a, and are preferably in the regions that do not overlap with the regions where the bumps 109R, 109G, 109B are formed. This is for reducing the amounts of lights shielded by the contact metals 104R, 104G, 104B at the time of light emission from the light-emitting devices 105R, 105G, 105B, and makes it possible to enhance light output efficiency. Since the light emission side wiring layers 110 are so formed as not to overlap with the light-emitting devices 105R, 105G, 105B, the lights emitted from the light-emitting devices 105R, 105G, 105B and radiated from the light output surfaces 105a are not shielded by the light emission side wiring layers 110, so that it is possible to enhance the light output efficiency and to perform light emission and image display with good display characteristics.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A light-emitting device comprising:
   a light-emitting device main body having a light output surface, and
   a transparent electrode formed in a size larger than a size of the light output surface so as to cover the light output surface, wherein
   the light-emitting device main body is provided in the form of a chip that includes a plurality of semiconductor layers, wherein
   the transparent electrode is connected directly to a whole area of the light output surface, and
   wherein the transparent electrode is connected to the light output surface through a contact metal layer, wherein a size of the contact metal layer is minute relative to the size of the light output surface, wherein the light-emitting device main body is fixed to an insulation resin layer, wherein a portion of the light-emitting device main body protrudes from the insulation resin layer so as to generate a step between a surface of the insulation resin layer and the light output surface.

2. The light-emitting device as set forth in claim 1, wherein the transparent electrode provides direct connection between a wiring for supplying electric power to the light-emitting device main body, and wherein the wiring is formed outside the region of the light output surface.

3. The light-emitting device as set forth in claim 1, wherein the transparent electrode is a light-transmitting resin containing one or more conductive particulates dispersed therein.

4. The light-emitting device as set forth in claim 3, wherein the conductive particulates scatter light emitted from the light output surface and diffuse the light from the transparent electrode to an exterior of the device.

5. The light-emitting device as set forth in claim 3, wherein the conductive particulates include indium tin oxide.

6. The light-emitting device as set forth in claim 3, wherein a resin layer formed on the upper side of said transparent electrode.

7. The light-emitting device as set forth in claim 6, wherein the refractive index of the transparent electrode is lower than the refractive index of the semiconductor layer including the light output surface and is higher than the refractive index of a resin layer provided on the upper side of a transparent electrode.

8. A light emitting device comprising:
   a light-emitting device main body having a light output surface, and
   a transparent electrode formed in a size larger than a size of the light output surface so as to cover the light output surface and connected directly to a whole area of the light output surface,
   wherein the transparent electrode is connected to the light output surface through a contact metal layer, wherein a size of the contact metal layer is minute relative to the size of the light output surface, wherein the light-emitting device main body is fixed to an insulation resin layer, wherein a portion of the light-emitting device main body protrudes from the insulation resin layer so as to generate a step between a surface of the insulation resin layer and the light output surface.

9. A semiconductor light-emitting apparatus comprising:
   a plurality of light-emitting device main bodies each having a light output surface and transferred, and
   a transparent electrode formed to be larger in size than the light output surfaces so as to cover the light output surfaces and connected directly to a whole areas of the light output surfaces,
   wherein the transparent electrode is connected to the light output surface through a contact metal layer, wherein a size of the contact metal layer is minute relative to the size of the light output surface, wherein one or more of the light-emitting device main bodies are fixed to an insulation resin layer, wherein a portion of the light-emitting device main bodies protrude from the insulation resin layer so as to generate a step between a surface of the insulation resin layer and the light output surface.

10. The semiconductor light-emitting apparatus as set forth in claim 9, wherein the transparent electrode is formed collectively on the light output surfaces of the plurality of light-emitting device main bodies.

11. The semiconductor light-emitting apparatus as set forth in claim 9, wherein the transparent electrode is formed by coating the light output surfaces with a paste containing one or more conductive particulates dispersed in a light-transmitting resin.

12. The semiconductor light-emitting apparatus as set forth in claim 11, wherein the conductive particulates scatter light emitted from the light output surfaces and diffuse the light from the transparent electrode to an exterior of the apparatus.

13. An image display apparatus comprising an image display surface formed by arranging a plurality of light-emitting devices on an apparatus substrate, each of the light-emitting devices comprising a light-emitting device main body having a light output surface and transferred, and a transparent electrode formed in a size larger than a size of the light output surface so as to cover the light output surface and connected to whole area of the light output surface through a contact metal layer, wherein a size of the contact metal layer is less than the size of the light output surface, wherein the light-emitting device main body is fixed to an insulation resin layer, wherein a portion of the light-emitting device main body protrudes from the insulation resin layer so as to generate a step between a surface of the insulation resin layer and the light output surface.

14. A light-emitting apparatus comprising:
a light-emitting device comprising a light-emitting device main body having a light output surface and transferred, and a contact metal formed on the light output surface;
a wiring layer formed outside the region of the light output surface; and
a transparent electrode so formed as to cover the contact metal and the wiring layer, wherein the light-emitting device main body is fixed to an insulation resin layer, wherein a portion of the light-emitting device main body protrudes from the insulation resin layer so as to generate a step between a surface of the insulation resin layer and the light output surface.

15. The light-emitting apparatus as set forth in claim 14, wherein the transparent electrode is formed in a size larger than a size of the light output surface and connected directly to a whole area of the light output surface.

16. The light-emitting apparatus as set forth in claim 14, wherein the surface, making contact with the transparent electrode, of the contact metal is formed of a noble metal.

17. The light-emitting apparatus as set forth in claim 14, wherein the surface, making contact with the transparent electrode, of the wiring layer is formed of a noble metal.

18. The light-emitting apparatus as set forth in claim 14, further comprising a protective resin layer so formed as to cover the transparent electrode.

19. The light-emitting apparatus as set forth in claim 18, further comprising a diffusion preventive layer for preventing mutual diffusion of a component of the protective resin layer and a component of the transparent electrode, between the protective resin layer and the transparent electrode.

20. An image display apparatus comprising an image display surface formed by arranging a plurality of light-emitting apparatuses on an apparatus substrate, each of the light-emitting apparatuses comprising a plurality of light-emitting devices each of which comprises a light-emitting device main body having light output surface and transferred, and a contact metal formed on the light output surface; a wiring layer formed outside the regions of the light output surfaces; and a transparent electrode so formed as to cover the contact metals and the wiring layer, wherein a size of the contact metal is less than a size of the light output surface, wherein the light-emitting device main body is fixed to an insulation resin layer, wherein a portion of the light-emitting device main body protrudes from the insulation resin layer so as to generate a step between a surface of the insulation resin layer and the light output surface.

21. A light-emitting device comprising:
a light-emitting device main body having a light output surface, and
a transparent electrode formed in a size larger than a size of the light output surface so as to cover the light output surface, wherein the light-emitting device main body is fixed to an insulation resin layer, wherein a portion of the light-emitting device main body protrudes from the insulation resin layer so as to generate a step between a surface of the insulation resin layer and the light output surface.

22. The light-emitting device of claim 21, wherein the light output surface includes a side surface, and wherein a contact metal layer is formed on at least a portion of the side surface to provide a connection between the transparent electrode and the light output surface.

* * * * *